United States Patent
Kim et al.

(10) Patent No.: US 11,784,751 B1
(45) Date of Patent: Oct. 10, 2023

(54) LIST SIZE REDUCTION FOR POLAR DECODING

(71) Applicant: QUALCOMM Incorporated, San Diego, CA (US)

(72) Inventors: Hobin Kim, San Diego, CA (US); Hengjie Yang, Los Angeles, CA (US); Hari Sankar, San Diego, CA (US); Erman Koken, La Jolla, CA (US); Seyyed Ali Hashemi, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/745,628

(22) Filed: May 16, 2022

(51) Int. Cl.
*H03M 13/00* (2006.01)
*H04L 1/00* (2006.01)
*H03M 13/15* (2006.01)

(52) U.S. Cl.
CPC ........ *H04L 1/0057* (2013.01); *H03M 13/159* (2013.01); *H03M 13/6572* (2013.01); *H04L 1/0045* (2013.01)

(58) Field of Classification Search
CPC .. H04L 1/0057; H04L 1/0045; H03M 13/159; H03M 13/6573
See application file for complete search history.

(56) References Cited

U.S. PATENT DOCUMENTS

| | | | | |
|---|---|---|---|---|
| 9,973,301 | B2 * | 5/2018 | Raza | H03M 13/37 |
| 10,153,787 | B2 * | 12/2018 | El-Khamy | H01L 22/10 |
| 10,581,465 | B2 * | 3/2020 | Lin | H03M 13/13 |
| 10,666,290 | B2 * | 5/2020 | Kim | H03M 7/3059 |
| 10,713,113 | B2 * | 7/2020 | Barbato | H04L 1/0052 |
| 10,727,873 | B1 * | 7/2020 | Old | G11C 29/52 |
| 11,336,306 | B2 * | 5/2022 | Kamiya | H03M 13/256 |

* cited by examiner

*Primary Examiner* — Esaw T Abraham
(74) *Attorney, Agent, or Firm* — Holland & Hart LLP

(57) ABSTRACT

Methods, systems, and devices for wireless communications are described. The user equipment (UE) may initiate a successive cancellation list (SCL) decoding procedure, and may perform the SCL decoding procedure across various nodes (e.g., for each information bit through a decoding tree). At each node, the UE may determine whether a relationship between a first path metric and a second path metric satisfy a threshold. In some examples, the UE may determine whether multiple thresholds are satisfied. If conditions are satisfied (e.g., the relationship between the two path metrics satisfies a threshold), then the UE may decrease a list size of the SCL decoding.

30 Claims, 13 Drawing Sheets

LIST SIZE REDUCTION FOR POLAR DECODING

FIELD OF TECHNOLOGY

The following relates to wireless communications, including list size reduction for polar decoding.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include one or more base stations, each supporting wireless communication for communication devices, which may be known as user equipment (UE).

SUMMARY

The described techniques relate to improved methods, systems, devices, and apparatuses that support list size reduction for polar decoding. A user equipment (UE) may initiate a successive cancellation list (SCL) decoding procedure, and may perform the SCL decoding procedure across various nodes (e.g., for each information bit through a decoding tree). At each node, the UE may determine whether a relationship between a first path metric and a second path metric satisfy a threshold. In some examples, the UE may determine whether multiple thresholds are satisfied. If conditions are satisfied (e.g., the relationship between the two path metrics satisfies a threshold), then the UE may decrease a list size of the SCL decoding.

A method for wireless communications at a user equipment (UE) is described. The method may include initiating successive cancellation list decoding for a set of multiple information bits according to a first list size, where the first list size is associated with a first number of decoding paths of a decoding tree for the set of multiple information bits, and where each decoding path of the first number of decoding paths is associated with a respective path metric of a set of path metrics, switching from the first list size to a second list size at a first node of the decoding tree based on a first path metric and a second path metric of the set of path metrics, where the second list size is associated with a second number of decoding paths of the decoding tree for the set of multiple information bits, and where the first path metric and the second path metric have lower path metric values than a remainder of the set of path metrics, and outputting the set of multiple information bits according to a result of the successive cancellation list decoding.

An apparatus for wireless communications at a UE is described. The apparatus may include a processor, memory coupled with the processor, and instructions stored in the memory. The instructions may be executable by the processor to cause the apparatus to initiate successive cancellation list decoding for a set of multiple information bits according to a first list size, where the first list size is associated with a first number of decoding paths of a decoding tree for the set of multiple information bits, and where each decoding path of the first number of decoding paths is associated with a respective path metric of a set of path metrics, switch from the first list size to a second list size at a first node of the decoding tree based on a first path metric and a second path metric of the set of path metrics, where the second list size is associated with a second number of decoding paths of the decoding tree for the set of multiple information bits, and where the first path metric and the second path metric have lower path metric values than a remainder of the set of path metrics, and output the set of multiple information bits according to a result of the successive cancellation list decoding.

Another apparatus for wireless communications at a UE is described. The apparatus may include means for initiating successive cancellation list decoding for a set of multiple information bits according to a first list size, where the first list size is associated with a first number of decoding paths of a decoding tree for the set of multiple information bits, and where each decoding path of the first number of decoding paths is associated with a respective path metric of a set of path metrics, means for switching from the first list size to a second list size at a first node of the decoding tree based on a first path metric and a second path metric of the set of path metrics, where the second list size is associated with a second number of decoding paths of the decoding tree for the set of multiple information bits, and where the first path metric and the second path metric have lower path metric values than a remainder of the set of path metrics, and means for outputting the set of multiple information bits according to a result of the successive cancellation list decoding.

A non-transitory computer-readable medium storing code for wireless communications at a UE is described. The code may include instructions executable by a processor to initiate successive cancellation list decoding for a set of multiple information bits according to a first list size, where the first list size is associated with a first number of decoding paths of a decoding tree for the set of multiple information bits, and where each decoding path of the first number of decoding paths is associated with a respective path metric of a set of path metrics, switch from the first list size to a second list size at a first node of the decoding tree based on a first path metric and a second path metric of the set of path metrics, where the second list size is associated with a second number of decoding paths of the decoding tree for the set of multiple information bits, and where the first path metric and the second path metric have lower path metric values than a remainder of the set of path metrics, and output the set of multiple information bits according to a result of the successive cancellation list decoding.

In some examples of the method, apparatuses, and non-transitory computer-readable medium described herein, switching from the first list size to the second list size may include operations, features, means, or instructions for selecting the second list size based on a comparison between the first path metric and a product of the second path metric and a path metric threshold.

In some examples of the method, apparatuses, and non-transitory computer-readable medium described herein, switching from the first list size to the second list size may include operations, features, means, or instructions for selecting the second list size based on a difference between the first path metric and the second path metric.

In some examples of the method, apparatuses, and non-transitory computer-readable medium described herein, switching from the first list size to the second list size may include operations, features, means, or instructions for selecting the second list size based on a ratio between the first path metric and the second path metric.

Some examples of the method, apparatuses, and non-transitory computer-readable medium described herein may further include operations, features, means, or instructions for selecting the first path metric from the set of path metrics, where the first path metric may have a lowest value of the set of path metrics and the second path metric may have a value that may be higher than the first path metric and lower than the remainder of the set of path metrics of the set of path metrics.

In some examples of the method, apparatuses, and non-transitory computer-readable medium described herein, switching from the first list size to the second list size may include operations, features, means, or instructions for selecting the second list size based on a number of information bits of the set of multiple information bits previously processed during the successive cancellation list decoding satisfying a processing threshold.

In some examples of the method, apparatuses, and non-transitory computer-readable medium described herein, switching from the first list size to the second list size may include operations, features, means, or instructions for selecting the second list size based on a comparison between the first path metric and the second path metric satisfying a first path metric threshold and a second path metric threshold that may be different from the first path metric threshold, the first path metric threshold corresponding to the second list size and the second path metric threshold corresponding to a third list size associated with a third number of decoding paths for the set of multiple information bits.

Some examples of the method, apparatuses, and non-transitory computer-readable medium described herein may further include operations, features, means, or instructions for updating the first path metric, the second path metric, a number of information bits of the set of multiple information bits previously processed during the successive cancellation list decoding, or any combination thereof and performing the successive cancellation list decoding at a second node of the decoding tree based on the updated first path metric, the updated second path metric, the updated number of information bits previously processed during the successive cancellation list decoding, or any combination thereof, where outputting the set of multiple information bits may be based on performing the successive cancellation list decoding at a set of multiple nodes of the decoding tree including at least the first node and the second node.

In some examples of the method, apparatuses, and non-transitory computer-readable medium described herein, the second list size may be smaller than the first list size.

DETAILED DESCRIPTION

Figure 1:
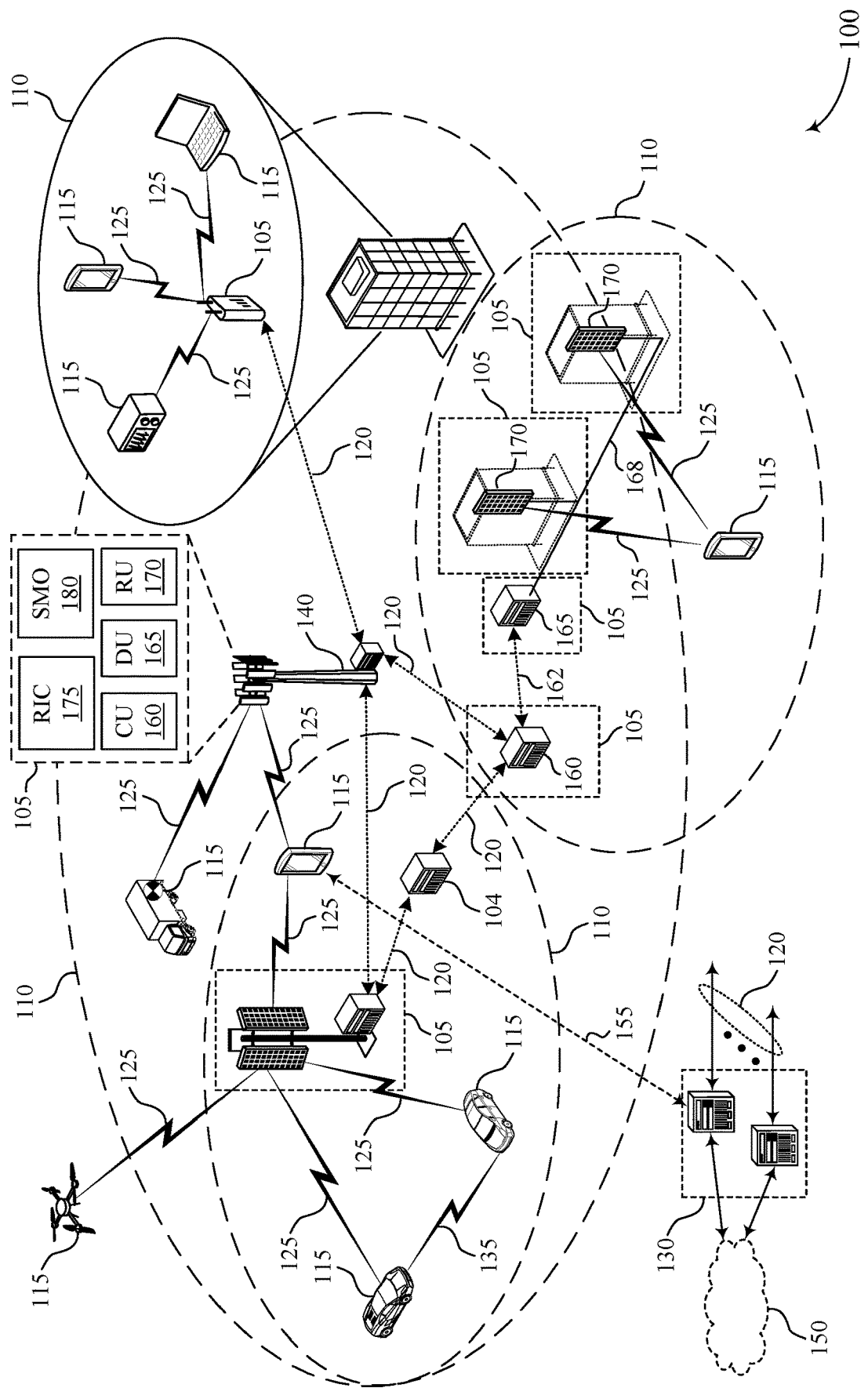
FIG. 1 illustrates an example of a wireless communications system that supports list size reduction for polar decoding in accordance with one or more aspects of the present disclosure.

Some wireless communications systems may support polar decoding between network entities and user equipments (UEs). A UE may receive downlink signaling (e.g., on a control channel) that is encoded using polar coding. The UE may decode the downlink signaling using a successive cancellation list (SCL) decoding procedure. For the SCL decoding, the UE may (for each node of a decoding tree) maintain a number of lists (e.g., decoding paths) until a full message (e.g., a full set of information bits) is decoded. Maintaining a large list size (e.g., a large number of decoding paths) may result in improved reliability of decoding, but may also result in increased latency (e.g., a large number of cycles to decode the full message). Maintaining a smaller list size (e.g., a smaller number of decoding paths) may increase the speed of decoding and decrease latency, but may result in decreased reliability of decoding. A balanced approach (decreasing a number of cycles without overly decreasing accuracy) may result in efficient and accurate decoding. Some decoding techniques may not support such a balance.

Techniques described herein may support a decoding procedure that reduces latency while maintaining a high level of decoding accuracy. A UE may support polar decoding according to an SCL decoding procedure by selecting a list size based on one or more parameters satisfying one or more thresholds. For example, a relationship (e.g., a difference, a ratio, or any other relationship) between two current best (e.g., lowest) path metrics of a set of path metrics for a current node of the decoding tree may determine whether the UE will sacrifice reliability of the decode by decreasing the list size, or not. Similarly, if a portion of information bits have already been processed, then a large list size may not have much of an impact on successfully decoding remaining information bits.

The UE may initiate an SCL decoding procedure, and may perform the SCL decoding procedure across various nodes (e.g., for each information bit through a decoding tree). At each node, the UE may determine whether a relationship between a first path metric and a second path metric (e.g., the lowest path metrics of the current list size) satisfy a threshold. For instance, the UE may determine whether the first metric is greater than or equal to the product of the second path metric and a threshold path metric value, or may determine whether a difference between the first path metric and the second path metric satisfy a threshold, or may determine whether a ratio between the first path metric and the second path metric satisfy a threshold. If conditions are satisfied (e.g., the relationship between the two path metrics satisfies a threshold), then the UE may decrease the list size (e.g., from L=8 to L=2), resulting in less maintained decoding paths for a next node, and faster decoding of remaining information bits. In some examples, the UE may determine whether multiple thresholds are satisfied. For example, if the relationship between the first and second path metrics satisfies a first (e.g., lower) threshold, then the UE may decrease the list size from a first list size (e.g., L=8) to a second list size (e.g., L=2). If the relationship between the first and second path metrics satisfies a second (e.g., higher) threshold, then the UE may decrease the list size from the first list size (e.g., L=8) to a third list size (e.g., L=1, in which case the UE may perform a successive cancelation decoding, instead of an SCL decoding). In some examples, the UE may only decrease the list size if a number of previously processed information bits satisfies a threshold (e.g., if enough information bits have been processed to render a high number of lists unnecessary).

Aspects of the disclosure are initially described in the context of wireless communications systems. Aspects of the disclosure are further illustrated by and described with reference to wireless communications systems, decoding trees, and flow diagrams. Aspects of the disclosure are further illustrated by and described with reference to apparatus diagrams, system diagrams, and flowcharts that relate to list size reduction for polar decoding.

FIG. 1 illustrates an example of a wireless communications system 100 that supports list size reduction for polar decoding in accordance with one or more aspects of the present disclosure. The wireless communications system 100 may include one or more network entities 105, one or more UEs 115, and a core network 130. In some examples, the wireless communications system 100 may be a Long Term Evolution (LTE) network, an LTE-Advanced (LTE-A) network, an LTE-A Pro network, a New Radio (NR) network, or a network operating in accordance with other systems and radio technologies, including future systems and radio technologies not explicitly mentioned herein.

The network entities 105 may be dispersed throughout a geographic area to form the wireless communications system 100 and may include devices in different forms or having different capabilities. In various examples, a network entity 105 may be referred to as a network element, a mobility element, a radio access network (RAN) node, or network equipment, among other nomenclature. In some examples, network entities 105 and UEs 115 may wirelessly communicate via one or more communication links 125 (e.g., a radio frequency (RF) access link). For example, a network entity 105 may support a coverage area 110 (e.g., a geographic coverage area) over which the UEs 115 and the network entity 105 may establish one or more communication links 125. The coverage area 110 may be an example of a geographic area over which a network entity 105 and a UE 115 may support the communication of signals according to one or more radio access technologies (RATs).

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115 or network entities 105, as shown in FIG. 1.

As described herein, a node of the wireless communications system 100, which may be referred to as a network node, or a wireless node, may be a network entity 105 (e.g., any network entity described herein), a UE 115 (e.g., any UE described herein), a network controller, an apparatus, a device, a computing system, one or more components, or another suitable processing entity configured to perform any of the techniques described herein. For example, a node may be a UE 115. As another example, a node may be a network entity 105. As another example, a first node may be configured to communicate with a second node or a third node. In one aspect of this example, the first node may be a UE 115, the second node may be a network entity 105, and the third node may be a UE 115. In another aspect of this example, the first node may be a UE 115, the second node may be a network entity 105, and the third node may be a network entity 105. In yet other aspects of this example, the first, second, and third nodes may be different relative to these examples. Similarly, reference to a UE 115, network entity 105, apparatus, device, computing system, or the like may include disclosure of the UE 115, network entity 105, apparatus, device, computing system, or the like being a node. For example, disclosure that a UE 115 is configured to receive information from a network entity 105 also discloses that a first node is configured to receive information from a second node.

In some examples, network entities 105 may communicate with the core network 130, or with one another, or both. For example, network entities 105 may communicate with the core network 130 via one or more backhaul communication links 120 (e.g., in accordance with an S1, N2, N3, or other interface protocol). In some examples, network entities 105 may communicate with one another over a backhaul communication link 120 (e.g., in accordance with an X2, Xn, or other interface protocol) either directly (e.g., directly between network entities 105) or indirectly (e.g., via a core network 130). In some examples, network entities 105 may communicate with one another via a midhaul communication link 162 (e.g., in accordance with a midhaul interface protocol) or a fronthaul communication link 168 (e.g., in accordance with a fronthaul interface protocol), or any combination thereof. The backhaul communication links 120, midhaul communication links 162, or fronthaul communication links 168 may be or include one or more wired links (e.g., an electrical link, an optical fiber link), one or more wireless links (e.g., a radio link, a wireless optical link), among other examples or various combinations thereof. A UE 115 may communicate with the core network 130 through a communication link 155.

One or more of the network entities 105 described herein may include or may be referred to as a base station 140 (e.g., a base transceiver station, a radio base station, an NR base station, an access point, a radio transceiver, a NodeB, an eNodeB (eNB), a next-generation NodeB or a giga-NodeB (either of which may be referred to as a gNB), a 5G NB, a next-generation eNB (ng-eNB), a Home NodeB, a Home eNodeB, or other suitable terminology). In some examples, a network entity 105 (e.g., a base station 140) may be implemented in an aggregated (e.g., monolithic, standalone) base station architecture, which may be configured to utilize a protocol stack that is physically or logically integrated within a single network entity 105 (e.g., a single RAN node, such as a base station 140).

In some examples, a network entity 105 may be implemented in a disaggregated architecture (e.g., a disaggregated base station architecture, a disaggregated RAN architecture), which may be configured to utilize a protocol stack that is physically or logically distributed among two or more network entities 105, such as an integrated access backhaul (IAB) network, an open RAN (O-RAN) (e.g., a network configuration sponsored by the O-RAN Alliance), or a virtualized RAN (vRAN) (e.g., a cloud RAN (C-RAN)). For example, a network entity 105 may include one or more of a central unit (CU) 160, a distributed unit (DU) 165, a radio unit (RU) 170, a RAN Intelligent Controller (RIC) 175 (e.g., a Near-Real Time RIC (Near-RT RIC), a Non-Real Time RIC (Non-RT RIC)), a Service Management and Orchestration (SMO) 180 system, or any combination thereof. An RU 170 may also be referred to as a radio head, a smart radio head, a remote radio head (RRH), a remote radio unit (RRU), or a transmission reception point (TRP). One or more components of the network entities 105 in a disaggregated RAN architecture may be co-located, or one or more components of the network entities 105 may be located in distributed locations (e.g., separate physical locations). In some examples, one or more network entities 105 of a disaggregated RAN architecture may be implemented as virtual units (e.g., a virtual CU (VCU), a virtual DU (VDU), a virtual RU (VRU)).

The split of functionality between a CU 160, a DU 165, and an RU 175 is flexible and may support different functionalities depending upon which functions (e.g., network layer functions, protocol layer functions, baseband functions, RF functions, and any combinations thereof) are performed at a CU 160, a DU 165, or an RU 175. For example, a functional split of a protocol stack may be employed between a CU 160 and a DU 165 such that the CU 160 may support one or more layers of the protocol stack and the DU 165 may support one or more different layers of the protocol stack. In some examples, the CU 160 may host upper protocol layer (e.g., layer 3 (L3), layer 2 (L2)) functionality and signaling (e.g., Radio Resource Control (RRC), service data adaption protocol (SDAP), Packet Data Convergence Protocol (PDCP)). The CU 160 may be connected to one or more DUs 165 or RUs 170, and the one or more DUs 165 or RUs 170 may host lower protocol layers, such as layer 1 (L1) (e.g., physical (PHY) layer) or L2 (e.g., radio link control (RLC) layer, medium access control (MAC) layer) functionality and signaling, and may each be at least partially controlled by the CU 160. Additionally, or alternatively, a functional split of the protocol stack may be employed between a DU 165 and an RU 170 such that the DU 165 may support one or more layers of the protocol stack and the RU 170 may support one or more different layers of the protocol stack. The DU 165 may support one or multiple different cells (e.g., via one or more RUs 170). In some cases, a functional split between a CU 160 and a DU 165, or between a DU 165 and an RU 170 may be within a protocol layer (e.g., some functions for a protocol layer may be performed by one of a CU 160, a DU 165, or an RU 170, while other functions of the protocol layer are performed by a different one of the CU 160, the DU 165, or the RU 170). A CU 160 may be functionally split further into CU control plane (CU-CP) and CU user plane (CU-UP) functions. A CU 160 may be connected to one or more DUs 165 via a midhaul communication link 162 (e.g., F1, F1-c, F1-u), and a DU 165 may be connected to one or more RUs 170 via a fronthaul communication link 168 (e.g., open fronthaul (FH) interface). In some examples, a midhaul communication link 162 or a fronthaul communication link 168 may be implemented in accordance with an interface (e.g., a channel) between layers of a protocol stack supported by respective network entities 105 that are in communication over such communication links.

In wireless communications systems (e.g., wireless communications system 100), infrastructure and spectral resources for radio access may support wireless backhaul link capabilities to supplement wired backhaul connections, providing an IAB network architecture (e.g., to a core network 130). In some cases, in an IAB network, one or more network entities 105 (e.g., IAB nodes 104) may be partially controlled by each other. One or more IAB nodes 104 may be referred to as a donor entity or an IAB donor. One or more DUs 165 or one or more RUs 170 may be partially controlled by one or more CUs 160 associated with a donor network entity 105 (e.g., a donor base station 140). The one or more donor network entities 105 (e.g., IAB donors) may be in communication with one or more additional network entities 105 (e.g., IAB nodes 104) via supported access and backhaul links (e.g., backhaul communication links 120). IAB nodes 104 may include an IAB mobile termination (IAB-MT) controlled (e.g., scheduled) by DUs 165 of a coupled IAB donor. An IAB-MT may include an independent set of antennas for relay of communications with UEs 115, or may share the same antennas (e.g., of an RU 170) of an IAB node 104 used for access via the DU 165 of the IAB node 104 (e.g., referred to as virtual IAB-MT (vIAB-MT)). In some examples, the IAB nodes 104 may include DUs 165 that support communication links with additional entities (e.g., IAB nodes 104, UEs 115) within the relay chain or configuration of the access network (e.g., downstream). In such cases, one or more components of the disaggregated RAN architecture (e.g., one or more IAB nodes 104 or components of IAB nodes 104) may be configured to operate according to the techniques described herein.

For instance, an access network (AN) or RAN may include communications between access nodes (e.g., an IAB donor), IAB nodes 104, and one or more UEs 115. The IAB donor may facilitate connection between the core network 130 and the AN (e.g., via a wired or wireless connection to the core network 130). That is, an IAB donor may refer to a RAN node with a wired or wireless connection to core network 130. The IAB donor may include a CU 160 and at least one DU 165 (e.g., and RU 170), in which case the CU 160 may communicate with the core network 130 over an interface (e.g., a backhaul link). IAB donor and IAB nodes 104 may communicate over an F1 interface according to a protocol that defines signaling messages (e.g., an F1 AP protocol). Additionally, or alternatively, the CU 160 may communicate with the core network over an interface, which may be an example of a portion of backhaul link, and may communicate with other CUs 160 (e.g., a CU 160 associated with an alternative IAB donor) over an Xn-C interface, which may be an example of a portion of a backhaul link.

An IAB node 104 may refer to a RAN node that provides IAB functionality (e.g., access for UEs 115, wireless self-backhauling capabilities). A DU 165 may act as a distributed scheduling node towards child nodes associated with the IAB node 104, and the IAB-MT may act as a scheduled node towards parent nodes associated with the IAB node 104. That is, an IAB donor may be referred to as a parent node in communication with one or more child nodes (e.g., an IAB donor may relay transmissions for UEs through one or more other IAB nodes 104). Additionally, or alternatively, an IAB node 104 may also be referred to as a parent node or a child node to other IAB nodes 104, depending on the relay chain or configuration of the AN. Therefore, the IAB-MT entity of IAB nodes 104 may provide a Uu interface for a child IAB node 104 to receive signaling from a parent IAB node 104, and the DU interface (e.g., DUs 165) may provide a Uu interface for a parent IAB node 104 to signal to a child IAB node 104 or UE 115.

For example, IAB node 104 may be referred to as a parent node that supports communications for a child IAB node, and referred to as a child IAB node associated with an IAB donor. The IAB donor may include a CU 160 with a wired or wireless connection (e.g., a backhaul communication link 120) to the core network 130 and may act as parent node to IAB nodes 104. For example, the DU 165 of IAB donor may relay transmissions to UEs 115 through IAB nodes 104, and may directly signal transmissions to a UE 115. The CU 160 of IAB donor may signal communication link establishment via an F1 interface to IAB nodes 104, and the IAB nodes 104 may schedule transmissions (e.g., transmissions to the UEs 115 relayed from the IAB donor) through the DUs 165. That is, data may be relayed to and from IAB nodes 104 via signaling over an NR Uu interface to MT of the IAB node 104. Communications with IAB node 104 may be scheduled by a DU 165 of IAB donor and communications with IAB node 104 may be scheduled by DU 165 of IAB node 104.

In the case of the techniques described herein applied in the context of a disaggregated RAN architecture, one or more components of the disaggregated RAN architecture may be configured to support list size reduction for polar decoding as described herein. For example, some operations described as being performed by a UE 115 or a network entity 105 (e.g., a base station 140) may additionally, or alternatively, be performed by one or more components of the disaggregated RAN architecture (e.g., IAB nodes 104, DUs 165, CUs 160, RUs 170, RIC 175, SMO 180).

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the network entities 105 and the network equipment including macro eNBs or gNBs, small cell eNBs or gNBs, or relay base stations, among other examples, as shown in FIG. 1.

The UEs 115 and the network entities 105 may wirelessly communicate with one another via one or more communication links 125 (e.g., an access link) over one or more carriers. The term "carrier" may refer to a set of RF spectrum resources having a defined physical layer structure for supporting the communication links 125. For example, a carrier used for a communication link 125 may include a portion of a RF spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers. Communication between a network entity 105 and other devices may refer to communication between the devices and any portion (e.g., entity, sub-entity) of a network entity 105. For example, the terms "transmitting," "receiving," or "communicating," when referring to a network entity 105, may refer to any portion of a network entity 105 (e.g., a base station 140, a CU 160, a DU 165, a RU 170) of a RAN communicating with another device (e.g., directly or via one or more other network entities 105).

Signal waveforms transmitted over a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may refer to resources of one symbol period (e.g., a duration of one modulation symbol) and one subcarrier, in which case the symbol period and subcarrier spacing may be inversely related. The quantity of bits carried by each resource element may depend on the modulation scheme (e.g., the order of the modulation scheme, the coding rate of the modulation scheme, or both) such that the more resource elements that a device receives and the higher the order of the modulation scheme, the higher the data rate may be for the device. A wireless communications resource may refer to a combination of an RF spectrum resource, a time resource, and a spatial resource (e.g., a spatial layer, a beam), and the use of multiple spatial resources may increase the data rate or data integrity for communications with a UE 115.

One or more numerologies for a carrier may be supported, where a numerology may include a subcarrier spacing ($\Delta f$) and a cyclic prefix. A carrier may be divided into one or more BWPs having the same or different numerologies. In some examples, a UE 115 may be configured with multiple BWPs. In some examples, a single BWP for a carrier may be active at a given time and communications for the UE 115 may be restricted to one or more active BWPs.

The time intervals for the network entities 105 or the UEs 115 may be expressed in multiples of a basic time unit which may, for example, refer to a sampling period of $T_s=1/(\Delta f_{max} \cdot N_f)$ seconds, where $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a quantity of slots. Alternatively, each frame may include a variable quantity of slots, and the quantity of slots may depend on subcarrier spacing. Each slot may include a quantity of symbol periods (e.g., depending on the length of the cyclic prefix prepended to each symbol period). In some wireless communications systems 100, a slot may further be divided into multiple mini-slots containing one or more symbols. Excluding the cyclic prefix, each symbol period may contain one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., a quantity of symbol periods in a TTI) may be variable. Additionally, or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a set of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to an amount of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

In some examples, a network entity 105 (e.g., a base station 140, an RU 170) may be movable and therefore provide communication coverage for a moving coverage area 110. In some examples, different coverage areas 110 associated with different technologies may overlap, but the different coverage areas 110 may be supported by the same network entity 105. In some other examples, the overlapping coverage areas 110 associated with different technologies may be supported by different network entities 105. The wireless communications system 100 may include, for example, a heterogeneous network in which different types of the network entities 105 provide coverage for various coverage areas 110 using the same or different radio access technologies.

The wireless communications system 100 may support synchronous or asynchronous operation. For synchronous operation, network entities 105 (e.g., base stations 140) may have similar frame timings, and transmissions from different network entities 105 may be approximately aligned in time. For asynchronous operation, network entities 105 may have different frame timings, and transmissions from different network entities 105 may, in some examples, not be aligned in time. The techniques described herein may be used for either synchronous or asynchronous operations.

Some UEs 115, such as MTC or IoT devices, may be low cost or low complexity devices and may provide for automated communication between machines (e.g., via Machine-to-Machine (M2M) communication). M2M communication or MTC may refer to data communication technologies that allow devices to communicate with one another or a network entity 105 (e.g., a base station 140) without human intervention. In some examples, M2M communication or MTC may include communications from devices that integrate sensors or meters to measure or capture information and relay such information to a central server or application program that makes use of the information or presents the information to humans interacting with the application program. Some UEs 115 may be designed to collect information or enable automated behavior of machines or other devices. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception concurrently). In some examples, half-duplex communications may be performed at a reduced peak rate. Other power conservation techniques for the UEs 115 include entering a power saving deep sleep mode when not engaging in active communications, operating over a limited bandwidth (e.g., according to narrowband communications), or a combination of these techniques. For example, some UEs 115 may be configured for operation using a narrowband protocol type that is associated with a defined portion or range (e.g., set of subcarriers or resource blocks (RBs)) within a carrier, within a guard-band of a carrier, or outside of a carrier.

The wireless communications system 100 may be configured to support ultra-reliable communications or low-latency communications, or various combinations thereof. For example, the wireless communications system 100 may be configured to support ultra-reliable low-latency communications (URLLC). The UEs 115 may be designed to support ultra-reliable, low-latency, or critical functions. Ultra-reliable communications may include private communication or group communication and may be supported by one or more services such as push-to-talk, video, or data. Support for ultra-reliable, low-latency functions may include prioritization of services, and such services may be used for public safety or general commercial applications. The terms ultra-reliable, low-latency, and ultra-reliable low-latency may be used interchangeably herein.

In some examples, a UE 115 may be able to communicate directly with other UEs 115 over a device-to-device (D2D) communication link 135 (e.g., in accordance with a peer-to-peer (P2P), D2D, or sidelink protocol). In some examples, one or more UEs 115 of a group that are performing D2D communications may be within the coverage area 110 of a network entity 105 (e.g., a base station 140, an RU 170), which may support aspects of such D2D communications being configured by or scheduled by the network entity 105. In some examples, one or more UEs 115 in such a group may be outside the coverage area 110 of a network entity 105 or may be otherwise unable to or not configured to receive transmissions from a network entity 105. In some examples, groups of the UEs 115 communicating via D2D communications may support a one-to-many (1:M) system in which each UE 115 transmits to each of the other UEs 115 in the group. In some examples, a network entity 105 may facilitate the scheduling of resources for D2D communications. In some other examples, D2D communications may be carried out between the UEs 115 without the involvement of a network entity 105.

In some systems, a D2D communication link 135 may be an example of a communication channel, such as a sidelink communication channel, between vehicles (e.g., UEs 115). In some examples, vehicles may communicate using vehicle-to-everything (V2X) communications, vehicle-to-vehicle (V2V) communications, or some combination of these. A vehicle may signal information related to traffic conditions, signal scheduling, weather, safety, emergencies, or any other information relevant to a V2X system. In some examples, vehicles in a V2X system may communicate with roadside infrastructure, such as roadside units, or with the network via one or more network nodes (e.g., network entities 105, base stations 140, RUs 170) using vehicle-to-network (V2N) communications, or with both.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the network entities 105 (e.g., base stations 140) associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

The wireless communications system 100 may operate using one or more frequency bands, which may be in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, which may be referred to as clusters, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (HF) or very high frequency (VHF) portion of the spectrum below 300 MHz.

The wireless communications system 100 may also operate in a super high frequency (SHF) region using frequency bands from 3 GHz to 30 GHz, also known as the centimeter band, or in an extremely high frequency (EHF) region of the spectrum (e.g., from 30 GHz to 300 GHz), also known as the millimeter band. In some examples, the wireless communications system 100 may support millimeter wave (mmW) communications between the UEs 115 and the network entities 105 (e.g., base stations 140, RUs 170), and EHF antennas of the respective devices may be smaller and more closely spaced than UHF antennas. In some examples, this may facilitate use of antenna arrays within a device. The propagation of EHF transmissions, however, may be subject to even greater atmospheric attenuation and shorter range than SHF or UHF transmissions. The techniques disclosed herein may be employed across transmissions that use one or more different frequency regions, and designated use of bands across these frequency regions may differ by country or regulating body.

The wireless communications system 100 may utilize both licensed and unlicensed RF spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. While operating in unlicensed RF spectrum bands, devices such as the network entities 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A network entity 105 (e.g., a base station 140, an RU 170) or a UE 115 may be equipped with multiple antennas, which may be used to employ techniques such as transmit diversity, receive diversity, multiple-input multiple-output (MIMO) communications, or beamforming. The antennas of a network entity 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a network entity 105 may be located in diverse geographic locations. A network entity 105 may have an antenna array with a set of rows and columns of antenna ports that the network entity 105 may use to support beamforming of communications with a UE 115. Likewise, a UE 115 may have one or more antenna arrays that may support various MIMO or beamforming operations. Additionally, or alternatively, an antenna panel may support RF beamforming for a signal transmitted via an antenna port.

The network entities 105 or the UEs 115 may use MIMO communications to exploit multipath signal propagation and increase the spectral efficiency by transmitting or receiving multiple signals via different spatial layers. Such techniques may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream and may carry information associated with the same data stream (e.g., the same codeword) or different data streams (e.g., different codewords). Different spatial layers may be associated with different antenna ports used for channel measurement and reporting. MIMO techniques include single-user MIMO (SU-MIMO), where multiple spatial layers are transmitted to the same receiving device, and multiple-user MIMO (MU-MIMO), where multiple spatial layers are transmitted to multiple devices.

Beamforming, which may also be referred to as spatial filtering, directional transmission, or directional reception, is a signal processing technique that may be used at a transmitting device or a receiving device (e.g., a network entity 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

A network entity 105 or a UE 115 may use beam sweeping techniques as part of beamforming operations. For example, a network entity 105 (e.g., a base station 140, an RU 170) may use multiple antennas or antenna arrays (e.g., antenna panels) to conduct beamforming operations for directional communications with a UE 115. Some signals (e.g., synchronization signals, reference signals, beam selection signals, or other control signals) may be transmitted by a network entity 105 multiple times along different directions. For example, the network entity 105 may transmit a signal according to different beamforming weight sets associated with different directions of transmission. Transmissions along different beam directions may be used to identify (e.g., by a transmitting device, such as a network entity 105, or by a receiving device, such as a UE 115) a beam direction for later transmission or reception by the network entity 105.

Some signals, such as data signals associated with a particular receiving device, may be transmitted by transmitting device (e.g., a transmitting network entity 105, a transmitting UE 115) along a single beam direction (e.g., a direction associated with the receiving device, such as a receiving network entity 105 or a receiving UE 115). In some examples, the beam direction associated with transmissions along a single beam direction may be determined based on a signal that was transmitted along one or more beam directions. For example, a UE 115 may receive one or more of the signals transmitted by the network entity 105 along different directions and may report to the network entity 105 an indication of the signal that the UE 115 received with a highest signal quality or an otherwise acceptable signal quality.

In some examples, transmissions by a device (e.g., by a network entity 105 or a UE 115) may be performed using multiple beam directions, and the device may use a combination of digital precoding or beamforming to generate a combined beam for transmission (e.g., from a network entity 105 to a UE 115). The UE 115 may report feedback that indicates precoding weights for one or more beam directions, and the feedback may correspond to a configured set of beams across a system bandwidth or one or more subbands. The network entity 105 may transmit a reference signal (e.g., a cell-specific reference signal (CRS), a channel state information reference signal (CSI-RS)), which may be precoded or unprecoded. The UE 115 may provide feedback for beam selection, which may be a precoding matrix indicator (PMI) or codebook-based feedback (e.g., a multi-panel type codebook, a linear combination type codebook, a port selection type codebook). Although these techniques are described with reference to signals transmitted along one or more directions by a network entity 105 (e.g., a base station 140, an RU 170), a UE 115 may employ similar techniques for transmitting signals multiple times along different directions (e.g., for identifying a beam direction for subsequent transmission or reception by the UE 115) or for transmitting a signal along a single direction (e.g., for transmitting data to a receiving device).

A receiving device (e.g., a UE 115) may perform reception operations in accordance with multiple receive configurations (e.g., directional listening) when receiving various signals from a receiving device (e.g., a network entity 105), such as synchronization signals, reference signals, beam selection signals, or other control signals. For example, a receiving device may perform reception in accordance with multiple receive directions by receiving via different antenna subarrays, by processing received signals according to different antenna subarrays, by receiving according to different receive beamforming weight sets (e.g., different directional listening weight sets) applied to signals received at multiple antenna elements of an antenna array, or by processing received signals according to different receive beamforming weight sets applied to signals received at multiple antenna elements of an antenna array, any of which may be referred to as "listening" according to different receive configurations or receive directions. In some examples, a receiving device may use a single receive configuration to receive along a single beam direction (e.g., when receiving a data signal). The single receive configuration may be aligned along a beam direction determined based on listening according to different receive configuration directions (e.g., a beam direction determined to have a highest signal strength, highest signal-to-noise ratio (SNR), or otherwise acceptable signal quality based on listening according to multiple beam directions).

The wireless communications system 100 may be a packet-based network that operates according to a layered protocol stack. In the user plane, communications at the bearer or PDCP layer may be IP-based. An RLC layer may perform packet segmentation and reassembly to communicate over logical channels. A MAC layer may perform priority handling and multiplexing of logical channels into transport channels. The MAC layer may also use error detection techniques, error correction techniques, or both to support retransmissions at the MAC layer to improve link efficiency. In the control plane, the RRC protocol layer may provide establishment, configuration, and maintenance of an RRC connection between a UE 115 and a network entity 105 or a core network 130 supporting radio bearers for user plane data. At the PHY layer, transport channels may be mapped to physical channels.

A UE 115 may initiate an SCL decoding procedure to decode information transmitted using network coding by a network entity or another device. The UE 115 may perform the SCL decoding procedure across various logical nodes (e.g., for each information bit through a decoding tree). At each node, the UE 115 may determine whether a relationship between a first path metric and a second path metric (e.g., the lowest path metrics of the current list size) satisfy a threshold.

For instance, the UE 115 may determine whether the first metric is greater than or equal to the product of the second path metric and a threshold path metric value, or may determine whether a difference between the first path metric and the second path metric satisfy a threshold, or may determine whether a ratio between the first path metric and the second path metric satisfy a threshold.

If conditions are satisfied (e.g., the relationship between the two path metrics satisfies a threshold), then the UE 115 may decrease the list size (e.g., from L=8 to L=2), resulting in less maintained decoding paths for a next node, and faster decoding of remaining information bits. In some examples, the UE 115 may determine whether multiple thresholds are satisfied. For example, if the relationship between the first and second path metrics satisfies a first (e.g., lower) threshold, then the UE 115 may decrease the list size from a first list size (e.g., L=8) to a second list size (e.g., L=2). If the relationship between the first and second path metrics satisfies a second (e.g., higher) threshold, then the UE may decrease the list size from the first list size (e.g., 8L=) to a third list size (e.g., L=1, in which case the UE 115 may perform a successive cancelation decoding, instead of an SCL decoding). In some examples, the UE may only decrease the list size if a number of previously processed information bits satisfies a threshold (e.g., if enough information bits have been processed to render a high number of lists unnecessary).

Figure 2:
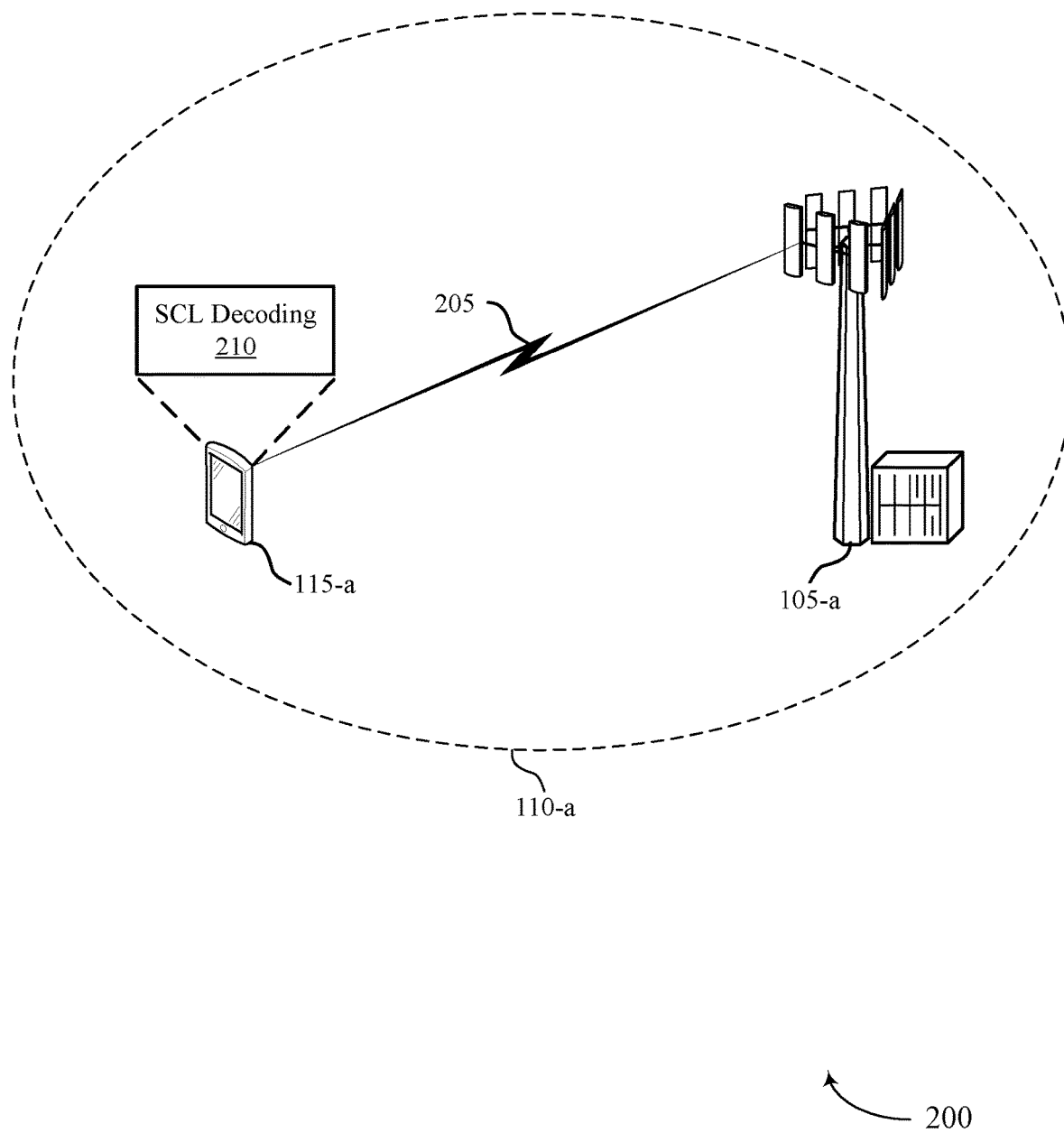
FIG. 2 illustrates an example of a wireless communications system that supports list size reduction for polar decoding in accordance with one or more aspects of the present disclosure.

FIG. 2 illustrates an example of a wireless communications system 200 that supports list size reduction for polar decoding in accordance with one or more aspects of the present disclosure. The wireless communications system 200 may include a network entity 105-*a* and a UE 115-*a*, which may be examples of corresponding devices described with reference to FIG. 1. The network entity 105-*a* may serve one or more UEs 115-*a* within a geographic coverage area 110-*a*.

The network entity 105-*a* may communicate with the UE 115-*a* via bidirectional communication link 205. In some examples, the network entity 105-*a* may perform polar coding for a downlink transmission to the UE 115-*a*. In some examples, the UE 115-*a* may perform polar decoding to decode the downlink transmission. In some examples, the UE 115-*a* may perform successive cancellation (SC) decoding.

In an SC decoding procedure, latency may be caused by sequential processing over a decoding tree. In some examples, the UE 115-*a* may perform successive cancelation list (SCL) decoding 210. For SCL decoding, the UE 115-*a* may maintain a list of decoding paths along the decoding tree, and each decoding path may have a path metric (e.g., a penalty value), as described in greater detail with reference to FIG. 3). A path metric may be an example of or refer to a metric in a decoder that provides a value for a quality (such as a level or measurement of "correctness") of the decoder or of the decoding procedure. The path metric may represent a reliability of a decoding path candidate or a probability that the corresponding decoding path candidate is the correct set of decoded bits. The path metric may be based on the determined bit metrics and the bit values selected at each bit channel. The SCL decoder may have a number of levels equal to the number of bit channels in the received codeword. For some coding schemes, a smaller value of a path cost may be associated with a higher quality of the decoder or of the decoding procedure, and a UE may calculate the path metric as an accumulated value over the decoding nodes.

In SC or SCL decoding, an amount of latency may be proportional to a number of survival paths on the decoding tree. One way to reduce latency may be to reduce a number of survival paths in SCL decoding 210. For instance, if the UE 115-*a* maintains a large list size (e.g., maintains a large number of simultaneous decoding paths of the decoding tree for each node of the decoding tree), the UE 115-*a* may perform a large number of cycles of the SCL decoding 210, and may also output decoded information bits with a high probability of accurate decoding. However, the increased accuracy may be achieved at the cost of increased latency.

The UE 115-*a* may be able to reduce latency by reducing list size, resulting in a reduction in a number of cycles in the SCL decoding 210. If the UE 115-*a* selectively reduces the list size when conditions are satisfied, as described herein, the UE 115-*a* may reduce latency under conditions in which such a reduction in time will not overly impact the accuracy of the decoding.

As described herein, the UE 115-*a* may achieve power savings (e.g., by reducing a number of cycles of the SCL decoding 210) while reducing performance loss of downlink signaling and polar decoding (e.g., for NR control channels (CCHs)). The UE 115-*a* may perform a dynamic list size reduction scheme. For example, the UE 115-*a* may perform single-threshold list size reduction (e.g., as described with reference to FIG. 4), or double-threshold list size reduction (e.g., as described in greater detail with reference to FIG. 5). In some examples, CCH signal detection may be based on a final path metric (PM) ratio of an SCL decoding 210.

In some examples, the UE 115-*a* may perform CCH signal detection based on a final path metric ratio of SCL decoding. For example, as described with reference to FIGS. 3-5, the UE 115-*a* may determine (e.g., for each node of a decoding tree) a set of one or more path metrics $\alpha$ for a list size L, where $\alpha=[\alpha_0, \alpha_1, \ldots, \alpha_{L-1}]$. a lowest (e.g., minimum) value of $\alpha$ for a given node (e.g., a last node in the decoding tree) may be referred to as $\alpha_{min}$ and a highest (e.g., maximum) value of $\alpha$ for the node may be referred to as $\alpha_{max}$. In some examples, a final PM ratio may be referred to as $\alpha_{max}/\alpha_{min}$. In some examples, the UE 115-*a* may determine the existence of a CCH signal if $\alpha_{max}/\alpha_{min} \geq \gamma$, where $\gamma \geq 1$ is a predetermined threshold.

The UE 115-*a* may perform a multi-stage decoding. For example, the UE 115-*a* may initialize the SCL decoder with a first list size (e.g., L=2), and may run the CCH signal detection based on the path metric ratio (e.g., perform CCH signal detection if $\alpha_{max}/\alpha_{min} \geq \gamma$. If the CCH signal is detected (e.g., if the decision is true), then the UE 115-*a* may run the SCL decoder with a second list size (e.g., L=8). Otherwise, the UE 115-*a* may terminate the polar coding. This may occur if the CCH signal exists (e.g., a first hypothesis) resulting from a misdetection error (e.g., the decision is false and the CCH signal exists), or if the CCH signal does not exist (e.g., a second hypothesis) resulting from a false alarm error (e.g., the decision is true, and no CCH signal exists. If there is a good separation (e.g., a separation that exceeds a threshold) between two probability density functions (PDFs) of a final path metric ratio, then the techniques described herein may be particularly reliable.

Figure 3:
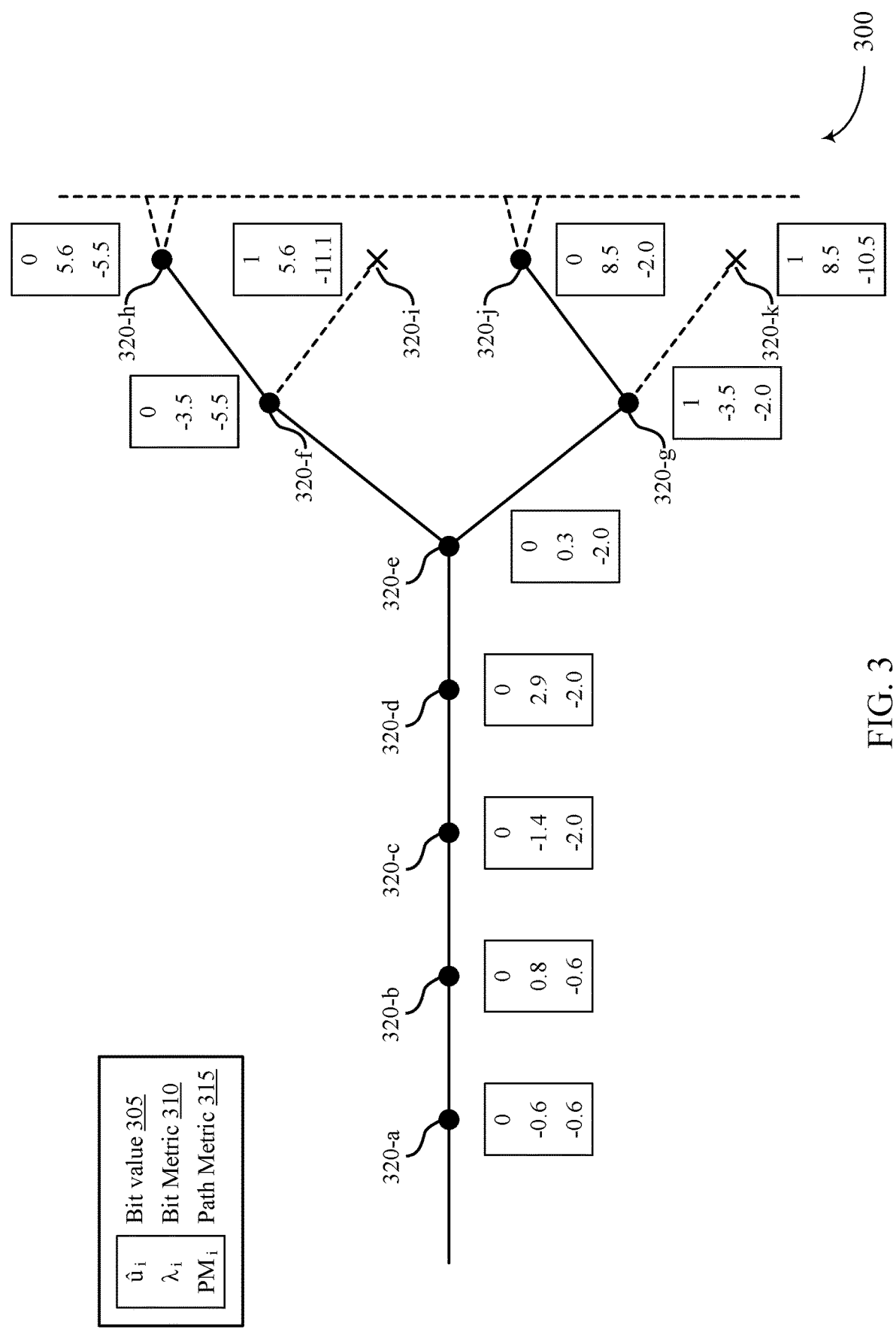
FIG. 3 illustrates an example of a decoding tree that supports list size reduction for polar decoding in accordance with one or more aspects of the present disclosure.

FIG. 3 illustrates an example of a decoding tree 300 that supports list size reduction for polar decoding in accordance with one or more aspects of the present disclosure. Decoding tree 300 may represent a list decoding operation performed by an SCL decoder of list size L=2. Each node 320 may represent an assigned bit for a decoding path candidate. The SCL decoder may calculate a corresponding bit value 305, bit metric 310, and path metric 315 associated with each node 320, and may determine the decoding path candidates based on these calculations.

In this specific example of a decoding operation, the SCL decoder may search for an eight bit codeword (e.g., transmitted over eight bit channels). The eight bit codeword may include five frozen bits (e.g., each with a default value of 0), followed by three information bits. A receiver may receive a candidate codeword over a control channel, and may send the candidate codeword to the SCL decoder. Based on the candidate codeword, the SCL decoder may determine a received LLR for each of the eight bit channels. For example, the set of received LLRs may contain LLR values of 2.9, 0.6, −1.8, −2.3, 5.9, 7.6, −1.4, and 2.0 for bit channels 1 through 8, respectively.

The SCL decoder may perform a list decoding operation on the set of received LLRs. Based on the sequential order of decoding, the SCL decoder may first decode node 320-a, representing the first bit channel, based on the set of received LLRs. The SCL decoder may determine a decoded LLR of −0.6 for the first bit channel. The SCL decoder may use the decoded LLRs as the bit metrics 310 for calculating path metrics 315 during the decoding process. Therefore, the SCL decoder may set the value of the first bit metric 310 to −0.6. In some cases, a negative value of a decoded LLR may indicate a 1 bit. However, since the expected codeword contains a frozen bit in the first bit channel, the SCL decoder may assign a bit value 305 of 0 to the first bit channel.

The SCL decoder may update the path metric 315 according to an accumulation of LLRs. The SCL decoder may select a preferred (e.g., best) path if a (e.g., absolute) path metric has a best (e.g., lowest or minimum) value. The SCL decoder may subtract the absolute value of a bit metric 310 from the path metric 315 if the SCL decoder assigned a bit value 305 not indicated by the LLR. In this way, the path metric 315 indicates unreliability of that decoding path. In this case, the SCL decoder assigned a 0 bit to the first bit channel, despite the LLR indicating a 1 bit (e.g., because the LLR has a negative value). Therefore, the SCL decoder may subtract the absolute value of the bit metric 310 (i.e., 0.6) from an initial value of the path metric 315 (i.e., 0). As the first bit channel of the expected codeword contains a frozen bit, both decoding path candidates of the L=2 SCL decoder may assign a 0 bit to this first decoded bit channel.

The SCL decoder may continue the decoding process for the next four frozen bits, indicated by nodes 320-b, 320-c, 320-d, and 320-e. Since the expected codeword contains frozen bits in the first five bit channels, the SCL decoder may assign bit values 305 of 0 to each of these bit channels. The SCL decoder may update the path metric 315 based on each bit metric 310 that does not indicate a 0 bit (e.g., the first bit metric of −0.6 and the third bit metric of −1.4). For each bit metric 310 that indicates the assigned bit, the SCL decoder may not update the path metric 315.

For the sixth bit channel, the SCL decoder may process two decoding path candidates due to the expected codeword containing an information bit in the sixth bit channel. Node 320-f may represent a bit value 305 of 0, while node 320-g may represent a bit value 305 of 1. Since the SCL decoder has a list size of L=2, one decoding path candidate may assign a bit value 305 of 0, and the other decoding path candidate may assign a bit value 305 of 1, for the sixth bit channel. The bit metric 310 may have a value of −3.5, which may indicate a 1 bit. Therefore, the SCL decoder may accumulate path metric for the decoding path candidate including node 320-f by 3.5, while the SCL decoder may not decrease the path metric for the decoding path candidate including node 320-g. At this point in the decoding process, the SCL decoder may identify the decoding path candidate including node 320-g as the most likely path corresponding to the codeword based on the current path metric 315.

The SCL decoder may proceed to decoding the seventh bit channel. To decode the seventh bit, a first decoding path (e.g., the decoding path including node 320-f) may process the bit values 305 and LLRs indicated by nodes 320-h and 320-i, and may calculate the corresponding bit metrics 310 and path metrics 315. Additionally, a second decoding path (e.g., the decoding path including node 320-g) may process the bit values 305 and LLRs indicated by nodes 320-j and 320-k, and may calculate the corresponding bit metrics 310 and path metrics 315. In some cases, the SCL decoder may keep the number of decoding path candidates equal to the list size. For example, the SCL decoder may prune the paths with path metrics 315 of −11.1 and −10.5.

As described with reference to FIG. 3 path metric may be accumulated, and a best path metric may be selected based on a (e.g., absolute) lowest (e.g., minimum) path metric value. Although illustrated with reference to a list size of L=2, similar techniques may be applied for higher or lower list sizes (e.g., L=8, L=2, etc.). In some examples, as described in greater detail with reference to FIG. 4, a UE may dynamically change (e.g., reduce) its list size if one or more conditions are satisfied (e.g., based on a relationship between two path metrics, such as the two lowest path metrics).

Figure 4:
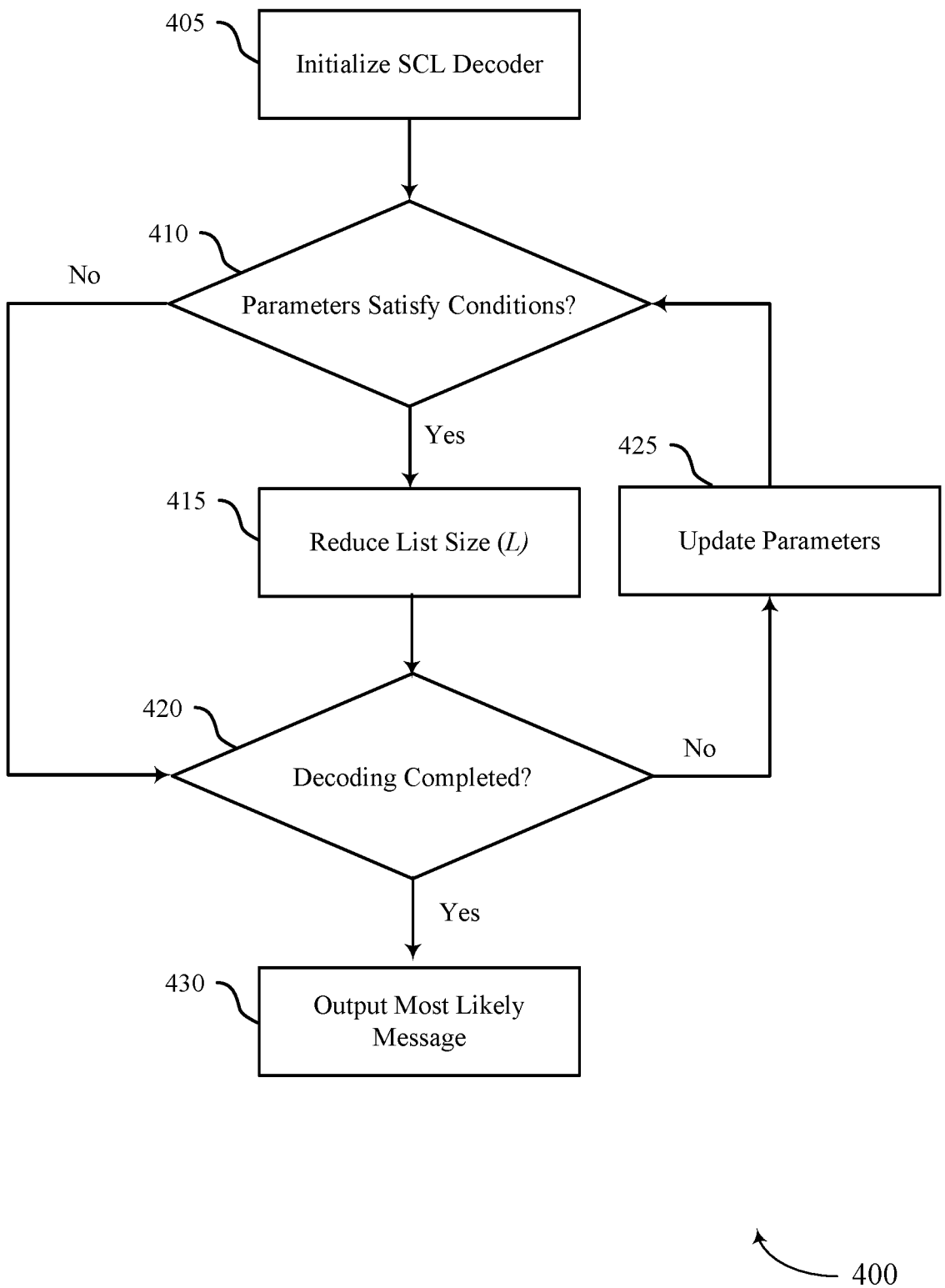
FIG. 4 illustrates an example of a flow diagram that supports list size reduction for polar decoding in accordance with one or more aspects of the present disclosure.

FIG. 4 illustrates an example of a flow diagram 400 that supports list size reduction for polar decoding in accordance with one or more aspects of the present disclosure. Flow diagram 400 may implement, or be implemented by, aspects of wireless communications system 100, wireless communications system 200, or decoding tree 300. For example, a UE (e.g., a UE 115 including an SCL decoder) may communicate with a network entity (e.g., a network entity 105). The UE may perform SCL decoding (e.g., as described with reference to FIGS. 2-3), and may dynamically change its list size while performing SCL decoding of downlink messages (e.g., or sidelink messages).

At 405, the UE may initialize its SCL decoder to perform SCL decoding on a set of bits (e.g., including one or more information bits). The UE may initialize the SCL decoder according to a first list size (e.g., L=8). The first list size may be associated with a first number of decoding paths of a decoding tree (e.g., for L=8 the SCL decoder may maintain 8 decoding paths). Each decoding path may be associated with a path metric. For example, the absolute path metrics at a particular (e.g., current) node of the decoding tree may be represented by absolute $\alpha=[\alpha_0, \alpha_1, \ldots, \alpha_{L-1}]$. In some examples, the UE may initialize the SCL decoder according to one or more threshold values (e.g., a number of information bits that have been processed I, or a path metric threshold value $A_{thr}$).

At 410, the UE may determine whether one or more parameters satisfy one or more conditions. In some examples, the UE may determine whether a relationship between a first metric value (e.g., and $\alpha_{min,2}$) satisfy a condition or rule. In some examples, $\alpha_{min,1}$ may represent a first or best (e.g., lowest) path metric value of $\alpha=[\alpha_0, \alpha_1, \ldots, \alpha_{L-1}]$ and may represent a second or second-best (e.g., next lowest after of $\alpha=[\alpha_0, \alpha_1, \ldots, \alpha_{L-1}]$. The UE may select the first and second path metrics from the set of path metrics $\alpha$. In some examples, the first path metric has a lowest value of the set of path metrics and the second path metric has a value that is higher than the first path metric and lower than the remainder of the set of path metrics of the set of path metrics. In some examples, $\alpha_{min,1}=\min \alpha$, and $\alpha_{min,2}=\min (\alpha/\{\alpha_{min,1}\})$. If the parameters do not satisfy the conditions, then the UE may maintain the list size (e.g., without reducing the list size), and may determine whether decoding is completed at 420. If the parameters do satisfy the conditions, then the UE may reduce the size (L) at 415 (e.g., may select a second list size based on the parameter satisfying the conditions).

In some examples, the UE may determine that the parameters satisfy the condition based on a comparison between one of the path metrics, and a product of the other path metric and the path metric threshold value $A_{thr}$. For instance, if $\alpha_{min,2} \geq A_{thr} \cdot \alpha_{min,1}$, then the UE may consider the conditions satisfied, and may reduce the size (L) at 415.

In some examples, the UE may determine that the parameters satisfy the conditions based on a difference between the first path metric and the second path metric. For instance, the UE may determine whether $\alpha_{min,2} - \alpha_{min,1}$ satisfies a threshold value. If so, the UE may consider the conditions satisfied, and may reduce the size (L) at 415.

In some examples, the UE may determine that the parameter satisfy the conditions based on a ratio between the first path metric and the second path metric. For instance, the UE may determine whether $$\frac{a_{min,2}}{a_{min,1}}$$

is greater than a threshold value, or may determine whether $$\frac{a_{max}}{a_{min}} \geq \gamma.$$

If so, then the UE may consider the conditions satisfied, and may reduce the size (L) at 415.

In some examples, the UE may determine whether the parameters satisfy a condition based on a number of information bits previously processed during the successive cancelation list decoding satisfying a threshold. For example, at 410, the UE may determine whether $I \geq I_{Thr}$. For example, if a large number of information bits have been already processed, then the likelihood that decreasing the list size will negatively impact an output message may be relatively small, whereas if only a small number of information bits have been previously processed, then decreasing the list size prematurely may result in decreased performance. In some examples, the size of I may have an inverse relationship to a ratio between the first and second path metrics. For example, for small values of I, $$\frac{a_{min,2}}{a_{min,1}}$$

may be large (e.g., an integer value greater than 1). In some examples, for larger values of I, $$\frac{a_{min,2}}{a_{min,1}}$$

may be close to 1.

At 415, if the parameters satisfy the one or more conditions at 410, the UE may reduce the list size (L). For example, the UE may reduce the list size from L=8 to L=2. In some examples, a message error rate (MER) of a dynamic list size reduction scheme (e.g., as described herein) may be bounded between MERs (e.g., an MER for L=2 and L=8.

At 420, the UE may determine whether the decoding is completed. If not, the UE may update parameters at 425. For example, the UE may update a value for $\alpha_{min,2}$ or both (e.g., from a new set of path metrics for the next node on the decoding tree). The UE may update a value for I, one or more thresholds (e.g., $I_{Thr}$, $A_{Thr}$, etc.), or both. The UE may update the parameter values based on having completed operations at 410, 415, and 420, for a first node (e.g., any node on the decoding tree). The UE may then update the parameters at 425, and determine whether the updated parameters satisfy the conditions at 410 for a next node in the decoding tree. At 420, the UE may determine whether the decoding is completed. If the decoding is completed, at 430, the UE may output the most likely message based on the dynamic list size reduction and SCL decoding described herein.

In some examples (e.g., as described with reference to FIG. 4), the UE may perform a single-threshold list size reduction scheme. The UE may balance performance and latency (e.g., for fading channels), which may result in a list reduction probability (e.g., about a ninety percent list reduction probability at an MER of 10-3. This may result in significant cycle savings, compared to the case where a higher list size (e.g., L=8) is used throughout the SCL decoding. In some examples, the UE may perform the dynamic SCL decoding based on multiple thresholds, and multiple possible list size reductions, as described in greater detail with reference to FIG. 5.

Figure 5:
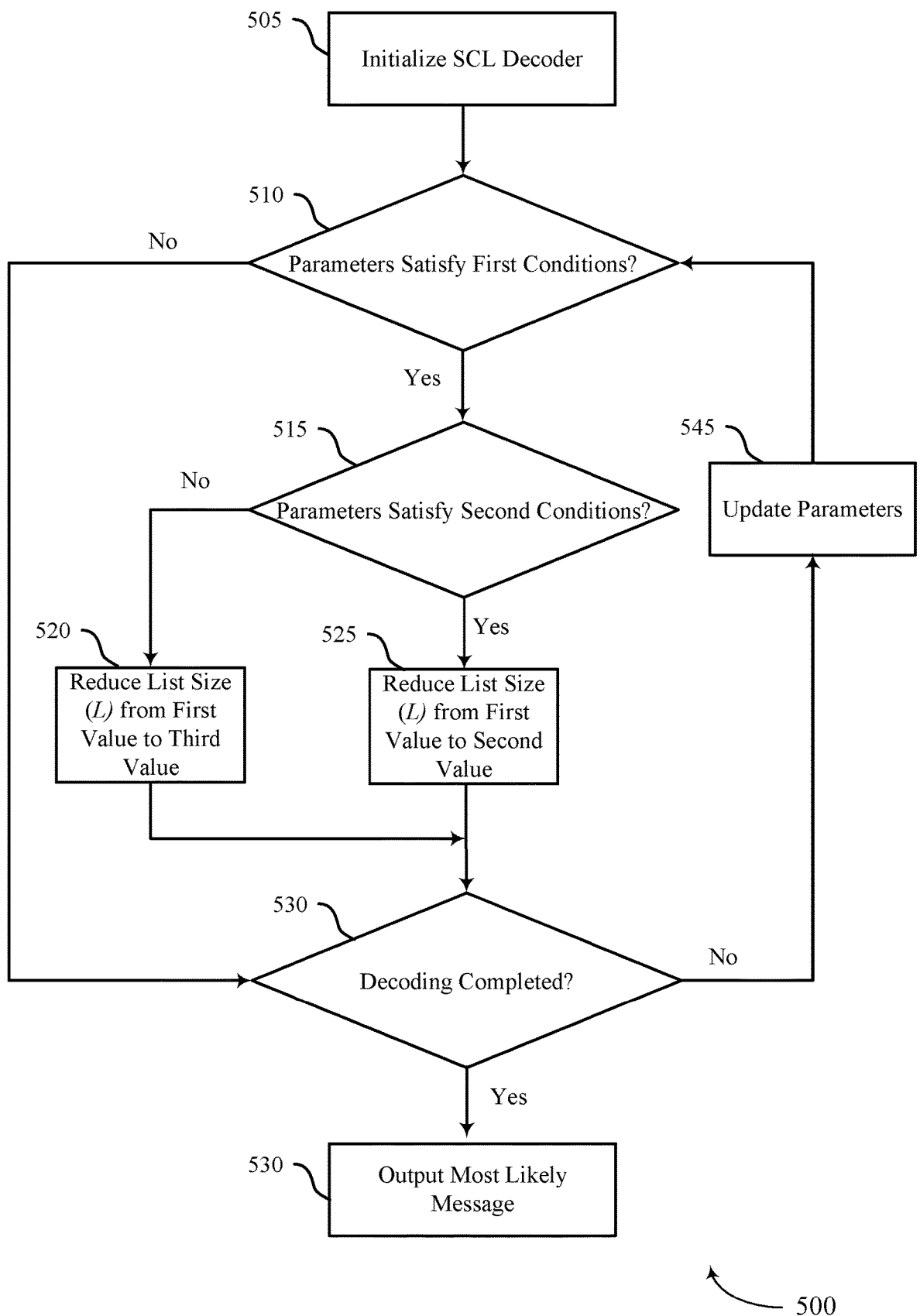
FIG. 5 illustrates an example of a flow diagram that supports list size reduction for polar decoding in accordance with one or more aspects of the present disclosure.

FIG. 5 illustrates an example of a flow diagram 500 that supports list size reduction for polar decoding in accordance with one or more aspects of the present disclosure. Flow diagram 400 may implement, or be implemented by, aspects of wireless communications system 100, wireless communications system 200, or decoding tree 300. For example, a UE (e.g., a UE 115 including an SCL decoder) may communicate with a network entity (e.g., a network entity 105). The UE may perform SCL decoding (e.g., as described with reference to FIGS. 2-3), and may dynamically change its list size while performing SCL decoding of downlink messages (e.g., or sidelink messages).

At 505, the UE may initialize its SCL decoder to perform SCL decoding on a set of bits (e.g., including one or more information bits). The UE may initialize the SCL decoder according to a first list size (e.g., L=8). The first list size may be associated with a first number of decoding paths of a decoding tree (e.g., for L=8 the SCL decoder may maintain 8 decoding paths). Each decoding path may be associated with a path metric. For example, the path metrics at a particular (e.g., current) node of the decoding tree may be represented by $\alpha = [\alpha_0, \alpha_1, \ldots, \alpha_{L-1}]$. In some examples, the UE may initialize the SCL decoder according to one or more threshold values (e.g., a number of information bits that have been processed I, or a path metric threshold value $A_{thr}$). The UE may initialize the SCL decoder to polar decode one or more signals received on a channel.

At 510, the UE may determine whether one or more parameters satisfy one or more first conditions. In some examples, the UE may determine whether a relationship between a first path metric value (e.g., and a second path metric value ($\alpha_{min,2}$) satisfies the first conditions. In some examples, $\alpha_{min,1}$ may represent a first or best (e.g., lowest) absolute path metric value of $\alpha = [\alpha_0, \alpha_1, \ldots, \alpha_{L-1}]$ and may represent a second or second-best (e.g., next lowest after of $\alpha = [\alpha_0, \alpha_1, \ldots, \alpha_{L-1}]$. The UE may select the first and second path metrics from the set of path metrics a. In some examples, the first path metric has a lowest value of the set of path metrics and the second path metric has a value that is higher than the first path metric and lower than the remainder of the set of path metrics of the set of path metrics. In some examples, $\alpha_{min,1} = \min \alpha$, and $\alpha_{min,2} = \min (\alpha / \{\alpha_{min,1}\})$. If the parameters do not satisfy the first conditions, then the UE may maintain the list size (e.g., without reducing the list size), and may determine whether decoding is completed at 530. If the parameters do satisfy the conditions, then the UE may determine whether the parameters satisfy one or more second conditions at 515.

In some examples, the first conditions and second conditions may be associated with list size reductions of different granularities. For example, if the parameters satisfy the first conditions at 510, and satisfy the second conditions at 515, then the UE may reduce the list size (L) from a first value to a second value (e.g., from L=8 to L=1) at 525. However, if the parameters satisfy the first conditions at 510 but do not satisfy the second conditions at 515, then the UE may reduce the list size (L) from the first value to a third value (e.g., from L=8 to L=2) at 520. This additional granularity may support improved flexibility, accuracy, and latency at the UE.

In some examples, the UE may determine that the parameters satisfy the condition based on a comparison between one of the path metrics, and a product of the other path metric and the path metric threshold value $A_{thr}$ at 510, and $B_{thr}$ at 515. For instance, $A_{thr}$ and $B_{thr}$ may be predetermined, preconfigured, or standardized thresholds, where $1 \leq A_{thr} < B_{thr}$. If $\alpha_{min,2} \geq A_{thr} \cdot \alpha_{min,1}$, then the UE may consider the first conditions satisfied. If $\alpha_{min,2} \geq B_{thr} \cdot \alpha_{min,1}$, then the UE may further consider the second conditions satisfied, and may reduce the list size (L) to the second value at 525 (e.g., L=1, where the UE performs SC decoding with a list size of 1, instead of SCL decoding). If $\alpha_{min,2} \geq A_{thr} \cdot \alpha_{min,1}$, but $\alpha_{min,2} < B_{thr} \cdot \alpha_{min,1}$, then the UE may reduce the size (L) from L=8 to L=2 at 520.

As described with reference to FIG. 4, the UE may determine whether the parameters satisfy the first conditions at 510, the second conditions at 515, or both, based on a relationship between the first path metric (e.g., $\alpha_{min,1}$) and the second path metric (e.g., $\alpha_{min,2}$). For example, the UE may determine whether a ratio between the first path metric and the second path metric satisfies a first threshold value at 510 and a second threshold value at 515, or may determine whether a difference between the first path metric and the second path matric satisfies a first threshold at 510 and a second threshold at 515.

In some examples, the UE may determine whether the parameters satisfy first condition and a second condition based on a number of information bits previously processed during the successive cancelation list decoding satisfying a threshold. For example, at 410, the UE may determine whether $I \geq I_{Thr,1}$ at 510, and may determine whether $I \geq I_{Thr,2}$ at 515.

At 530, the UE may determine whether the decoding is completed. If not, the UE may update parameters at 545. For example, the UE may update a value for $\alpha_{min,2}$ or both (e.g., from a new set of path metrics for the next node on the decoding tree). The UE may update a value for I, or one or more thresholds (e.g., $I_{Thr,1}$, $I_{Thr,2}$, $A_{Thr}$, $B_{Thr}$, etc.), or both. The UE may update the parameter values based on having completed operations at 510, 515, 520, and/or 525, for a first node (e.g., any node on the decoding tree). The UE may then update the parameters at 545, and determine whether the updated parameters satisfy the first conditions at 510, the second conditions at 515, or both, for a next node in the decoding tree. At 530, the UE may determine whether the decoding is completed. If the decoding is completed, then the UE may output the most likely message based on the dynamic list size reduction and the SCL decoding described herein.

In some examples, a double-threshold list size reduction scheme (e.g., as described with reference to FIG. 5) may perform well on fading channels. At an operating SNR, a transition from L=8 to L=1 may occur as frequently as or more frequently than a transition from L=8 to L=2. For aggregation levels greater than 2, single-threshold list size reduction or double-threshold list-size reduction schemes may result in list reduction probabilities that depend (e.g., primarily) on a target BLER. List size reduction schemes may reduce a number of cycles for decoding (e.g., resulting in decreased latency), but without the constant false alarm rates of consistently using a smaller list size (e.g., without initially starting the SCL decoding at a lower list size).

Figure 6:
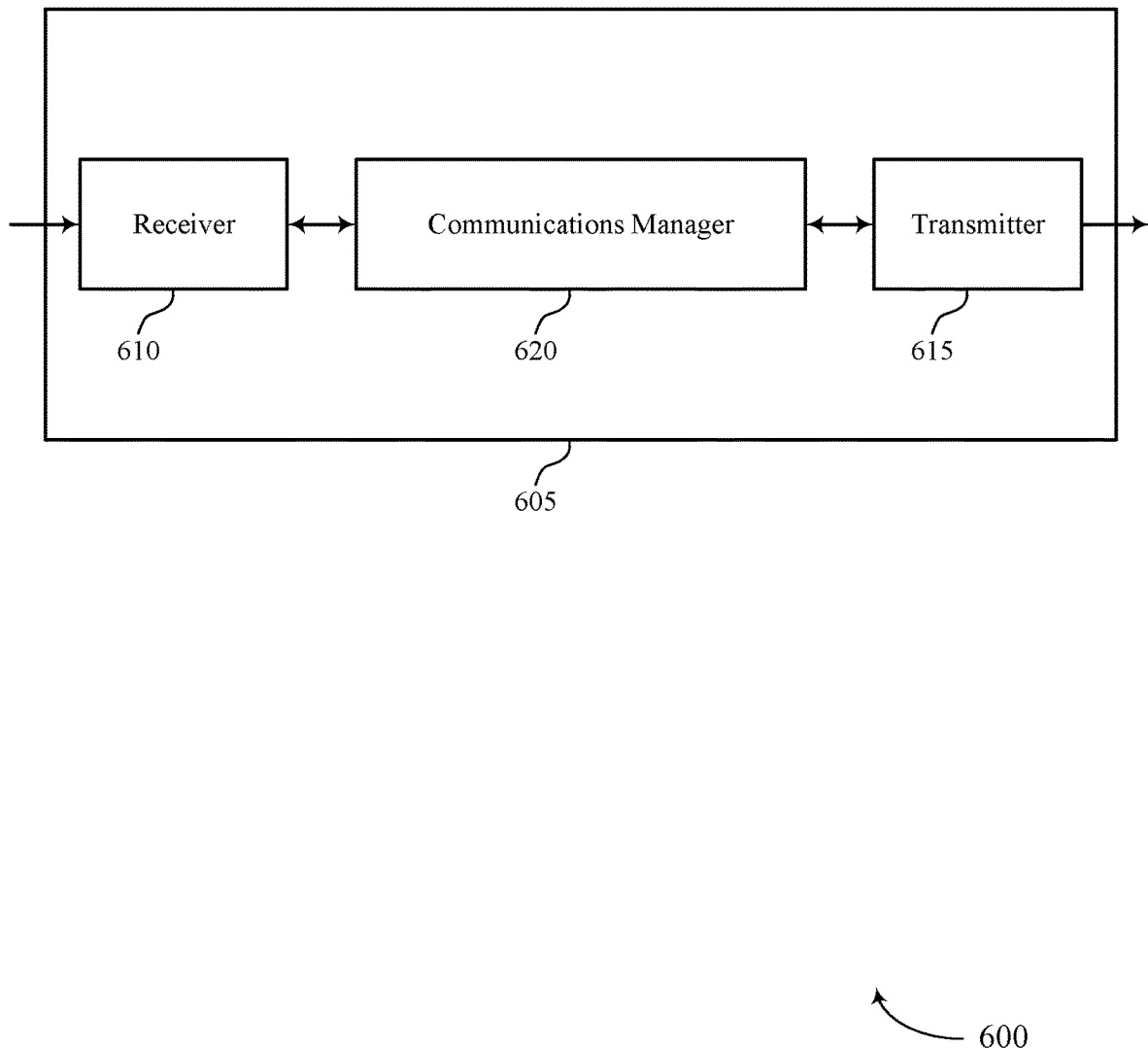
FIGS. 6 and 7 show block diagrams of devices that support list size reduction for polar decoding in accordance with one or more aspects of the present disclosure.

FIG. 6 shows a block diagram 600 of a device 605 that supports list size reduction for polar decoding in accordance with one or more aspects of the present disclosure. The device 605 may be an example of aspects of a UE 115 as described herein. The device 605 may include a receiver 610, a transmitter 615, and a communications manager 620. The device 605 may also include a processor. Each of these components may be in communication with one another (e.g., via one or more buses).

The receiver 610 may provide a means for receiving information such as packets, user data, control information, or any combination thereof associated with various information channels (e.g., control channels, data channels, information channels related to list size reduction for polar decoding). Information may be passed on to other components of the device 605. The receiver 610 may utilize a single antenna or a set of multiple antennas.

The transmitter 615 may provide a means for transmitting signals generated by other components of the device 605. For example, the transmitter 615 may transmit information such as packets, user data, control information, or any combination thereof associated with various information channels (e.g., control channels, data channels, information channels related to list size reduction for polar decoding). In some examples, the transmitter 615 may be co-located with a receiver 610 in a transceiver module. The transmitter 615 may utilize a single antenna or a set of multiple antennas.

The communications manager 620, the receiver 610, the transmitter 615, or various combinations thereof or various components thereof may be examples of means for performing various aspects of list size reduction for polar decoding as described herein. For example, the communications manager 620, the receiver 610, the transmitter 615, or various combinations or components thereof may support a method for performing one or more of the functions described herein.

In some examples, the communications manager 620, the receiver 610, the transmitter 615, or various combinations or components thereof may be implemented in hardware (e.g., in communications management circuitry). The hardware may include a processor, a digital signal processor (DSP), a central processing unit (CPU), an application-specific integrated circuit (ASIC), a field-programmable gate array (FPGA) or other programmable logic device, a microcontroller, discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally, or alternatively, in some examples, the communications manager 620, the receiver 610, the transmitter 615, or various combinations or components thereof may be implemented in code (e.g., as communications management software or firmware) executed by a processor. If implemented in code executed by a processor, the functions of the communications manager 620, the receiver 610, the transmitter 615, or various combinations or components thereof may be performed by a general-purpose processor, a DSP, a CPU, an ASIC, an FPGA, a microcontroller, or any combination of these or other programmable logic devices (e.g., configured as or otherwise supporting a means for performing the functions described in the present disclosure).

In some examples, the communications manager 620 may be configured to perform various operations (e.g., receiving, obtaining, monitoring, outputting, transmitting) using or otherwise in cooperation with the receiver 610, the transmitter 615, or both. For example, the communications manager 620 may receive information from the receiver 610, send information to the transmitter 615, or be integrated in combination with the receiver 610, the transmitter 615, or both to obtain information, output information, or perform various other operations as described herein.

The communications manager 620 may support wireless communications at a UE in accordance with examples as disclosed herein. For example, the communications manager 620 may be configured as or otherwise support a means for initiating successive cancellation list decoding for a set of multiple information bits according to a first list size, where the first list size is associated with a first number of decoding paths of a decoding tree for the set of multiple information bits, and where each decoding path of the first number of decoding paths is associated with a respective path metric of a set of path metrics. The communications manager 620 may be configured as or otherwise support a means for switching from the first list size to a second list size at a first node of the decoding tree based on a first path metric and a second path metric of the set of path metrics, where the second list size is associated with a second number of decoding paths of the decoding tree for the set of multiple information bits, and where the first path metric and the second path metric have lower path metric values than a remainder of the set of path metrics. The communications manager 620 may be configured as or otherwise support a means for outputting the set of multiple information bits according to a result of the successive cancellation list decoding.

By including or configuring the communications manager 620 in accordance with examples as described herein, the device 605 (e.g., a processor controlling or otherwise coupled with the receiver 610, the transmitter 615, the communications manager 620, or a combination thereof) may support techniques for decoding procedures resulting in reliable decoding, improved reception of control signaling, more reliable communication, decreased latency, more efficient use of available resources, and improved user experience.

Figure 7:
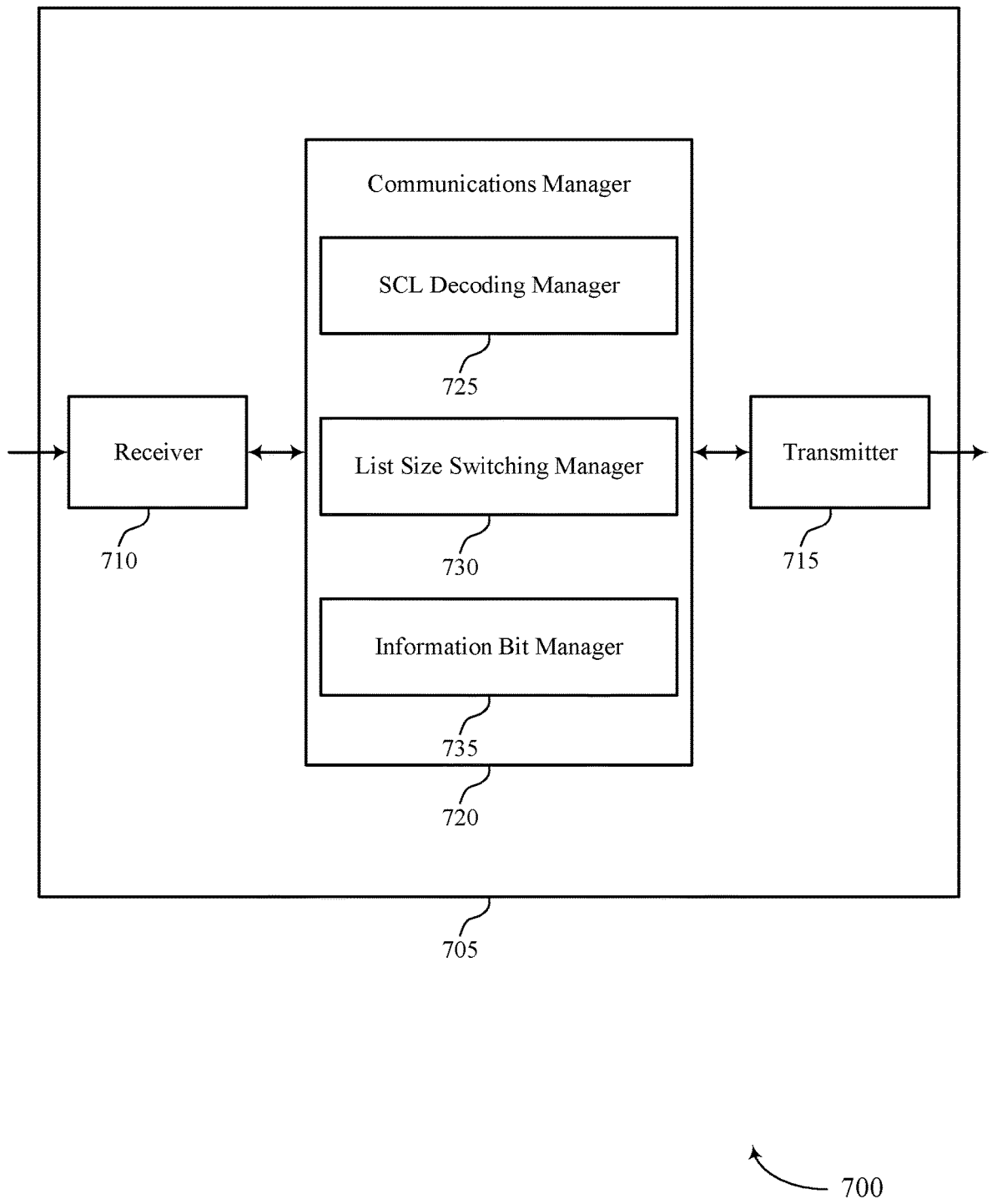

FIG. 7 shows a block diagram 700 of a device 705 that supports list size reduction for polar decoding in accordance with one or more aspects of the present disclosure. The device 705 may be an example of aspects of a device 605 or a UE 115 as described herein. The device 705 may include a receiver 710, a transmitter 715, and a communications manager 720. The device 705 may also include a processor. Each of these components may be in communication with one another (e.g., via one or more buses).

The receiver 710 may provide a means for receiving information such as packets, user data, control information, or any combination thereof associated with various information channels (e.g., control channels, data channels, information channels related to list size reduction for polar decoding). Information may be passed on to other components of the device 705. The receiver 710 may utilize a single antenna or a set of multiple antennas.

The transmitter 715 may provide a means for transmitting signals generated by other components of the device 705. For example, the transmitter 715 may transmit information such as packets, user data, control information, or any combination thereof associated with various information channels (e.g., control channels, data channels, information channels related to list size reduction for polar decoding). In some examples, the transmitter 715 may be co-located with a receiver 710 in a transceiver module. The transmitter 715 may utilize a single antenna or a set of multiple antennas.

The device 705, or various components thereof, may be an example of means for performing various aspects of list size reduction for polar decoding as described herein. For example, the communications manager 720 may include an SCL decoding manager 725, a list size switching manager 730, an information bit manager 735, or any combination thereof. The communications manager 720 may be an example of aspects of a communications manager 620 as described herein. In some examples, the communications manager 720, or various components thereof, may be configured to perform various operations (e.g., receiving, obtaining, monitoring, outputting, transmitting) using or otherwise in cooperation with the receiver 710, the transmitter 715, or both. For example, the communications manager 720 may receive information from the receiver 710, send information to the transmitter 715, or be integrated in combination with the receiver 710, the transmitter 715, or both to obtain information, output information, or perform various other operations as described herein.

The communications manager 720 may support wireless communications at a UE in accordance with examples as disclosed herein. The SCL decoding manager 725 may be configured as or otherwise support a means for initiating successive cancellation list decoding for a set of multiple information bits according to a first list size, where the first list size is associated with a first number of decoding paths of a decoding tree for the set of multiple information bits, and where each decoding path of the first number of decoding paths is associated with a respective path metric of a set of path metrics. The list size switching manager 730 may be configured as or otherwise support a means for switching from the first list size to a second list size at a first node of the decoding tree based on a first path metric and a second path metric of the set of path metrics, where the second list size is associated with a second number of decoding paths of the decoding tree for the set of multiple information bits, and where the first path metric and the second path metric have lower path metric values than a remainder of the set of path metrics. The information bit manager 735 may be configured as or otherwise support a means for outputting the set of multiple information bits according to a result of the successive cancellation list decoding.

Figure 8:
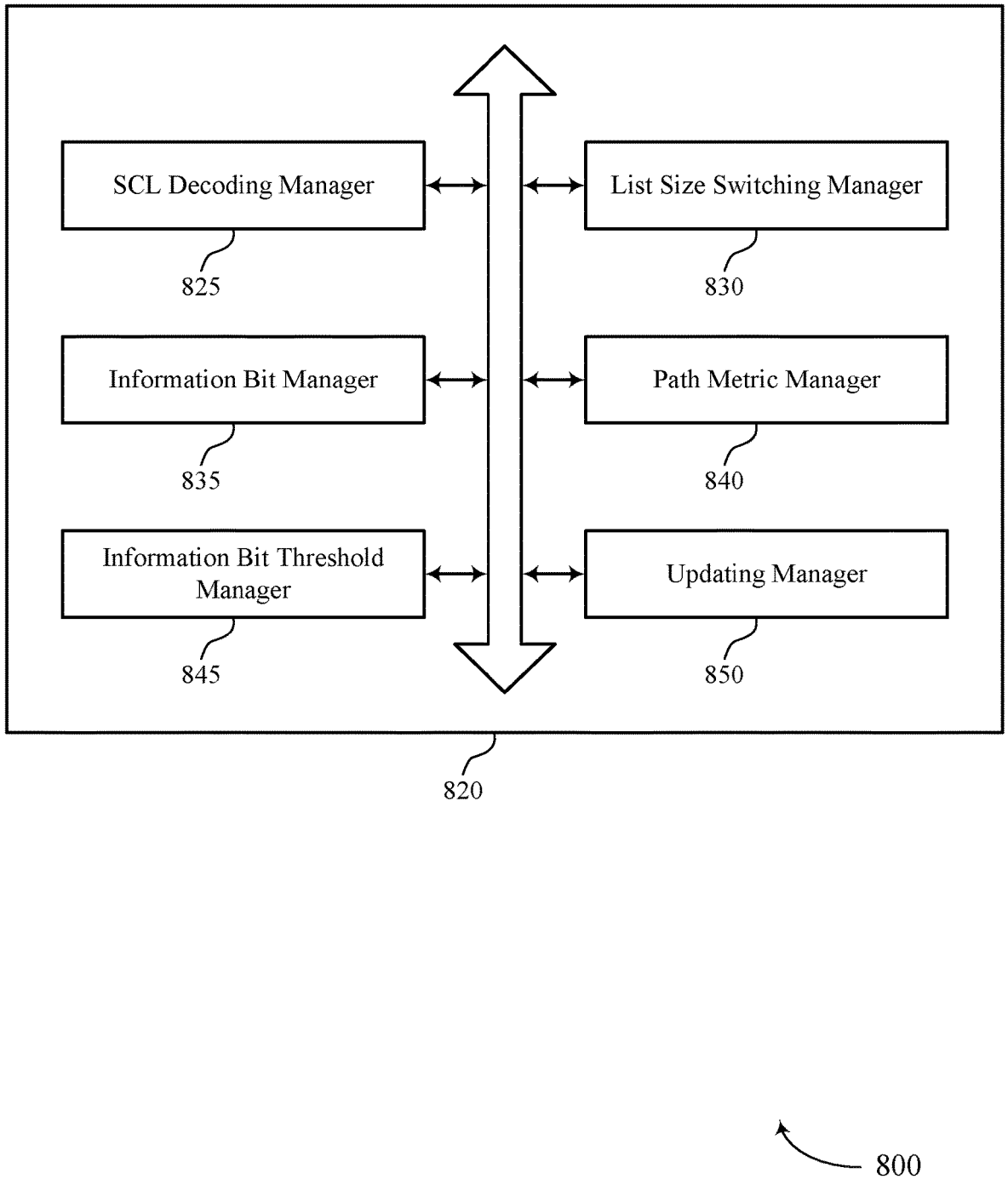
FIG. 8 shows a block diagram of a communications manager that supports list size reduction for polar decoding in accordance with one or more aspects of the present disclosure.

FIG. 8 shows a block diagram 800 of a communications manager 820 that supports list size reduction for polar decoding in accordance with one or more aspects of the present disclosure. The communications manager 820 may be an example of aspects of a communications manager 620, a communications manager 720, or both, as described herein. The communications manager 820, or various components thereof, may be an example of means for performing various aspects of list size reduction for polar decoding as described herein. For example, the communications manager 820 may include an SCL decoding manager 825, a list size switching manager 830, an information bit manager 835, a path metric manager 840, an information bit threshold manager 845, an updating manager 850, or any combination thereof. Each of these components may communicate, directly or indirectly, with one another (e.g., via one or more buses).

The communications manager 820 may support wireless communications at a UE in accordance with examples as disclosed herein. The SCL decoding manager 825 may be configured as or otherwise support a means for initiating successive cancellation list decoding for a set of multiple information bits according to a first list size, where the first list size is associated with a first number of decoding paths of a decoding tree for the set of multiple information bits, and where each decoding path of the first number of decoding paths is associated with a respective path metric of a set of path metrics. The list size switching manager 830 may be configured as or otherwise support a means for switching from the first list size to a second list size at a first node of the decoding tree based on a first path metric and a second path metric of the set of path metrics, where the second list size is associated with a second number of decoding paths of the decoding tree for the set of multiple information bits, and where the first path metric and the second path metric have lower path metric values than a remainder of the set of path metrics. The information bit manager 835 may be configured as or otherwise support a means for outputting the set of multiple information bits according to a result of the successive cancellation list decoding.

In some examples, to support switching from the first list size to the second list size, the path metric manager 840 may be configured as or otherwise support a means for selecting the second list size based on a comparison between the first path metric and a product of the second path metric and a path metric threshold.

In some examples, to support switching from the first list size to the second list size, the path metric manager 840 may be configured as or otherwise support a means for selecting the second list size based on a difference between the first path metric and the second path metric.

In some examples, to support switching from the first list size to the second list size, the path metric manager 840 may be configured as or otherwise support a means for selecting the second list size based on a ratio between the first path metric and the second path metric.

In some examples, the path metric manager 840 may be configured as or otherwise support a means for selecting the first path metric from the set of path metrics, where the first path metric has a lowest value of the set of path metrics and the second path metric has a value that is higher than the first path metric and lower than the remainder of the set of path metrics of the set of path metrics.

In some examples, to support switching from the first list size to the second list size, the information bit threshold manager 845 may be configured as or otherwise support a means for selecting the second list size based on a number of information bits of the set of multiple information bits previously processed during the successive cancellation list decoding satisfying a processing threshold.

In some examples, to support switching from the first list size to the second list size, the path metric manager 840 may be configured as or otherwise support a means for selecting the second list size based on a comparison between the first path metric and the second path metric satisfying a first path metric threshold and a second path metric threshold that is different from the first path metric threshold, the first path metric threshold corresponding to the second list size and the second path metric threshold corresponding to a third list size associated with a third number of decoding paths for the set of multiple information bits.

In some examples, the updating manager 850 may be configured as or otherwise support a means for updating the first path metric, the second path metric, a number of information bits of the set of multiple information bits previously processed during the successive cancellation list decoding, or any combination thereof. In some examples, the updating manager 850 may be configured as or otherwise support a means for performing the successive cancellation list decoding at a second node of the decoding tree based on the updated first path metric, the updated second path metric, the updated number of information bits previously processed during the successive cancellation list decoding, or any combination thereof, where outputting the set of multiple information bits is based on performing the successive cancellation list decoding at a set of multiple nodes of the decoding tree including at least the first node and the second node.

In some examples, the second list size is smaller than the first list size.

Figure 9:
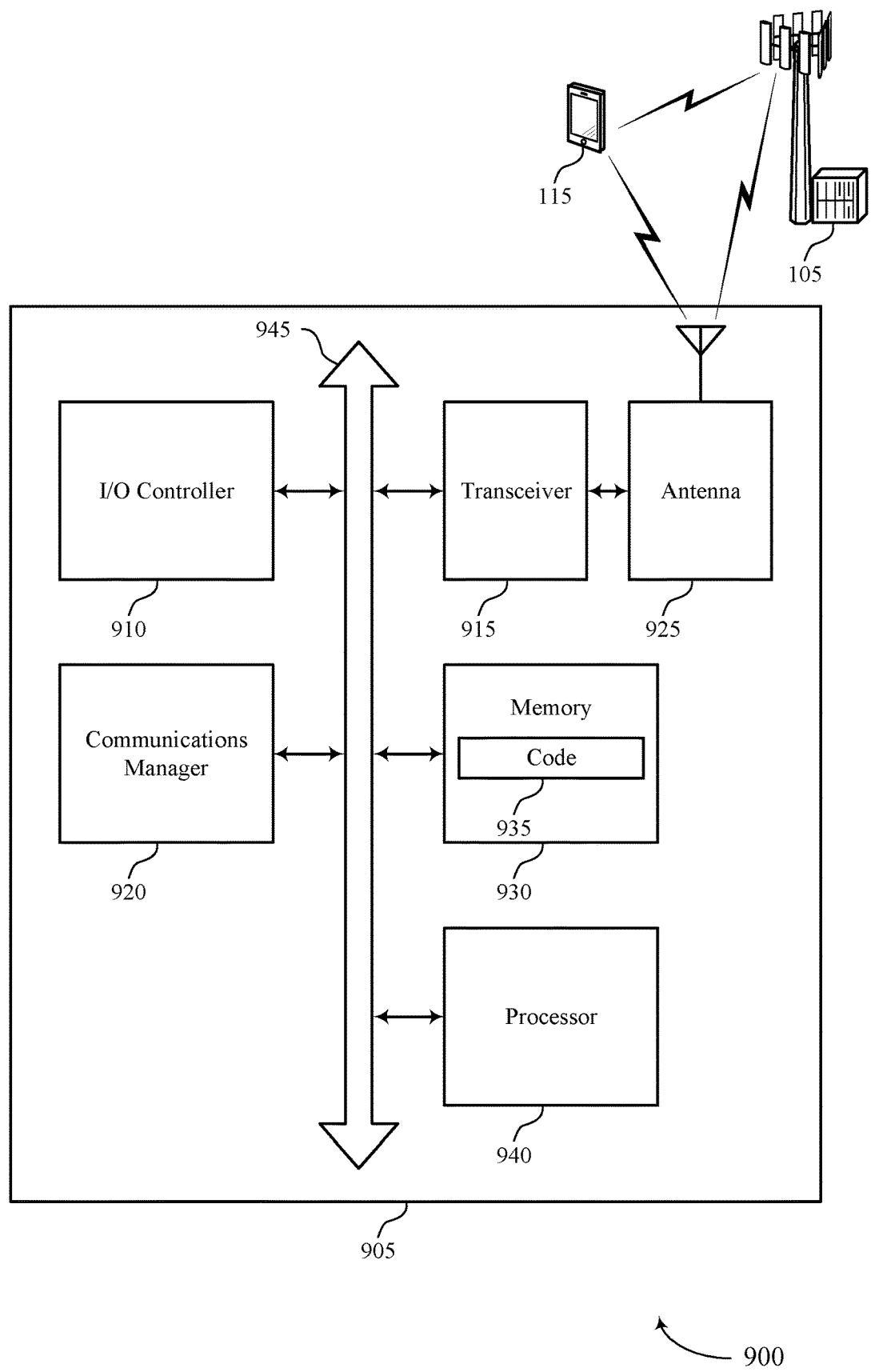
FIG. 9 shows a diagram of a system including a device that supports list size reduction for polar decoding in accordance with one or more aspects of the present disclosure.

FIG. 9 shows a diagram of a system 900 including a device 905 that supports list size reduction for polar decoding in accordance with one or more aspects of the present disclosure. The device 905 may be an example of or include the components of a device 605, a device 705, or a UE 115 as described herein. The device 905 may communicate (e.g., wirelessly) with one or more network entities 105, one or more UEs 115, or any combination thereof. The device 905 may include components for bidirectional voice and data communications including components for transmitting and receiving communications, such as a communications manager 920, an input/output (I/O) controller 910, a transceiver 915, an antenna 925, a memory 930, code 935, and a processor 940. These components may be in electronic communication or otherwise coupled (e.g., operatively, communicatively, functionally, electronically, electrically) via one or more buses (e.g., a bus 945).

The I/O controller 910 may manage input and output signals for the device 905. The I/O controller 910 may also manage peripherals not integrated into the device 905. In some cases, the I/O controller 910 may represent a physical connection or port to an external peripheral. In some cases, the I/O controller 910 may utilize an operating system such as iOS®, ANDROID®, MS-DOS®, MS-WINDOWS®, OS/2®, UNIX®, LINUX®, or another known operating system. Additionally or alternatively, the I/O controller 910 may represent or interact with a modem, a keyboard, a mouse, a touchscreen, or a similar device. In some cases, the I/O controller 910 may be implemented as part of a processor, such as the processor 940. In some cases, a user may interact with the device 905 via the I/O controller 910 or via hardware components controlled by the I/O controller 910.

In some cases, the device 905 may include a single antenna 925. However, in some other cases, the device 905 may have more than one antenna 925, which may be capable of concurrently transmitting or receiving multiple wireless transmissions. The transceiver 915 may communicate bi-directionally, via the one or more antennas 925, wired, or wireless links as described herein. For example, the transceiver 915 may represent a wireless transceiver and may communicate bi-directionally with another wireless transceiver. The transceiver 915 may also include a modem to modulate the packets, to provide the modulated packets to one or more antennas 925 for transmission, and to demodulate packets received from the one or more antennas 925. The transceiver 915, or the transceiver 915 and one or more antennas 925, may be an example of a transmitter 615, a transmitter 715, a receiver 610, a receiver 710, or any combination thereof or component thereof, as described herein.

The memory 930 may include random access memory (RAM) and read-only memory (ROM). The memory 930 may store computer-readable, computer-executable code 935 including instructions that, when executed by the processor 940, cause the device 905 to perform various functions described herein. The code 935 may be stored in a non-transitory computer-readable medium such as system memory or another type of memory. In some cases, the code 935 may not be directly executable by the processor 940 but may cause a computer (e.g., when compiled and executed) to perform functions described herein. In some cases, the memory 930 may contain, among other things, a basic I/O system (BIOS) which may control basic hardware or software operation such as the interaction with peripheral components or devices.

The processor 940 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 940 may be configured to operate a memory array using a memory controller. In some other cases, a memory controller may be integrated into the processor 940. The processor 940 may be configured to execute computer-readable instructions stored in a memory (e.g., the memory 930) to cause the device 905 to perform various functions (e.g., functions or tasks supporting list size reduction for polar decoding). For example, the device 905 or a component of the device 905 may include a processor 940 and memory 930 coupled with or to the processor 940, the processor 940 and memory 930 configured to perform various functions described herein.

The communications manager 920 may support wireless communications at a UE in accordance with examples as disclosed herein. For example, the communications manager 920 may be configured as or otherwise support a means for initiating successive cancellation list decoding for a set of multiple information bits according to a first list size, where the first list size is associated with a first number of decoding paths of a decoding tree for the set of multiple information bits, and where each decoding path of the first number of decoding paths is associated with a respective path metric of a set of path metrics. The communications manager 920 may be configured as or otherwise support a means for switching from the first list size to a second list size at a first node of the decoding tree based on a first path metric and a second path metric of the set of path metrics, where the second list size is associated with a second number of decoding paths of the decoding tree for the set of multiple information bits, and where the first path metric and the second path metric have lower path metric values than a remainder of the set of path metrics. The communications manager 920 may be configured as or otherwise support a means for outputting the set of multiple information bits according to a result of the successive cancellation list decoding.

By including or configuring the communications manager 920 in accordance with examples as described herein, the device 905 may support techniques for decoding procedures resulting in reliable decoding, improved reception of control signaling, more reliable communication, decreased latency, more efficient use of available resources, and improved user experience.

In some examples, the communications manager 920 may be configured to perform various operations (e.g., receiving, monitoring, transmitting) using or otherwise in cooperation with the transceiver 915, the one or more antennas 925, or any combination thereof. Although the communications manager 920 is illustrated as a separate component, in some examples, one or more functions described with reference to the communications manager 920 may be supported by or performed by the processor 940, the memory 930, the code 935, or any combination thereof. For example, the code 935 may include instructions executable by the processor 940 to cause the device 905 to perform various aspects of list size reduction for polar decoding as described herein, or the processor 940 and the memory 930 may be otherwise configured to perform or support such operations.

Figure 10:
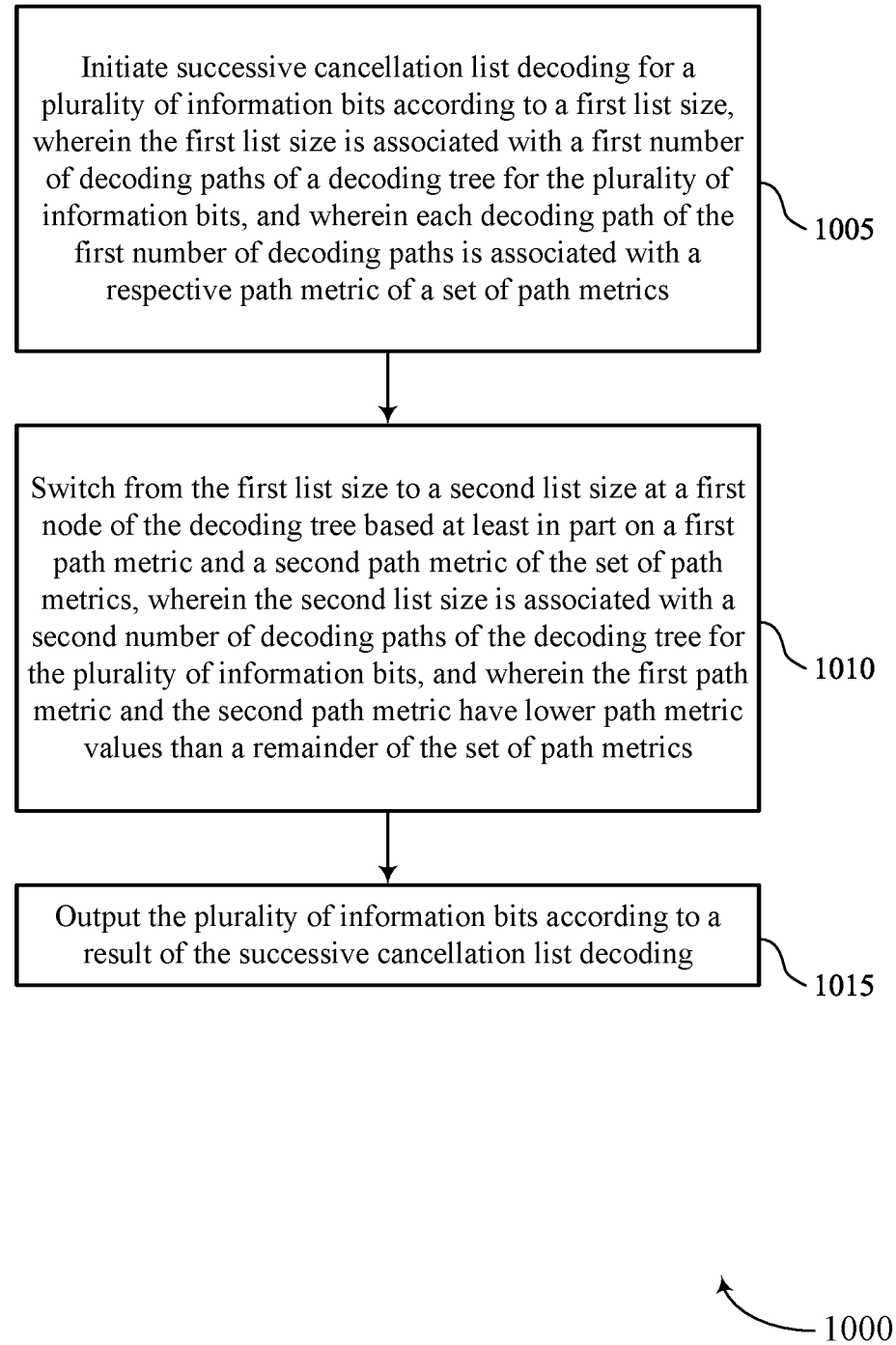
FIGS. 10 through 13 show flowcharts illustrating methods that support list size reduction for polar decoding in accordance with one or more aspects of the present disclosure.

FIG. 10 shows a flowchart illustrating a method 1000 that supports list size reduction for polar decoding in accordance with one or more aspects of the present disclosure. The operations of the method 1000 may be implemented by a UE or its components as described herein. For example, the operations of the method 1000 may be performed by a UE 115 as described with reference to FIGS. 1 through 9. In some examples, a UE may execute a set of instructions to control the functional elements of the UE to perform the described functions. Additionally, or alternatively, the UE may perform aspects of the described functions using special-purpose hardware.

At 1005, the method may include initiating successive cancellation list decoding for a set of multiple information bits according to a first list size, where the first list size is associated with a first number of decoding paths of a decoding tree for the set of multiple information bits, and where each decoding path of the first number of decoding paths is associated with a respective path metric of a set of path metrics. The operations of 1005 may be performed in accordance with examples as disclosed herein. In some examples, aspects of the operations of 1005 may be performed by an SCL decoding manager 825 as described with reference to FIG. 8.

At 1010, the method may include switching from the first list size to a second list size at a first node of the decoding tree based on a first path metric and a second path metric of the set of path metrics, where the second list size is associated with a second number of decoding paths of the decoding tree for the set of multiple information bits, and where the first path metric and the second path metric have lower path metric values than a remainder of the set of path metrics. The operations of 1010 may be performed in accordance with examples as disclosed herein. In some examples, aspects of the operations of 1010 may be performed by a list size switching manager 830 as described with reference to FIG. 8.

At 1015, the method may include outputting the set of multiple information bits according to a result of the successive cancellation list decoding. The operations of 1015 may be performed in accordance with examples as disclosed herein. In some examples, aspects of the operations of 1015 may be performed by an information bit manager 835 as described with reference to FIG. 8.

Figure 11:
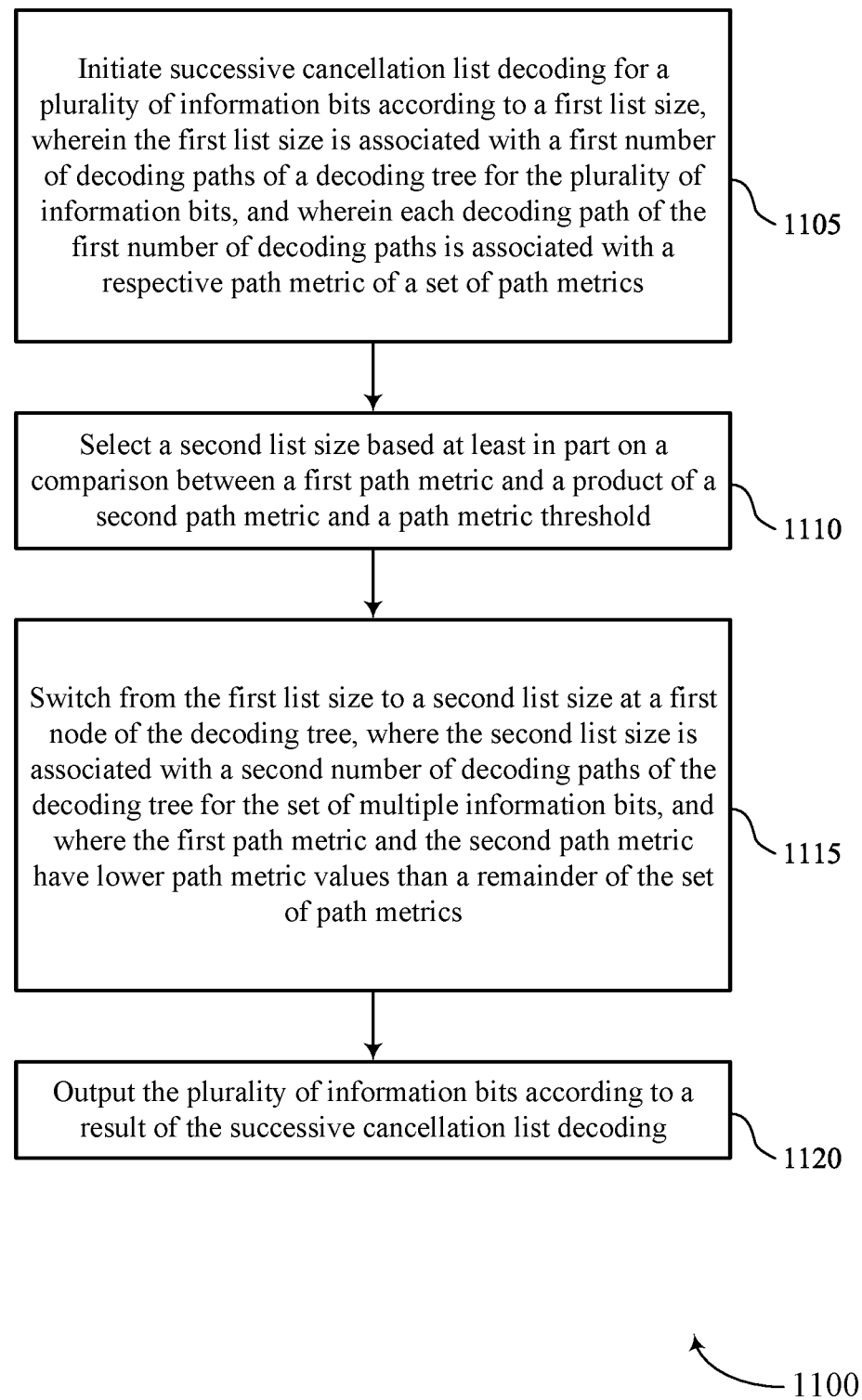

FIG. 11 shows a flowchart illustrating a method 1100 that supports list size reduction for polar decoding in accordance with one or more aspects of the present disclosure. The operations of the method 1100 may be implemented by a UE or its components as described herein. For example, the operations of the method 1100 may be performed by a UE 115 as described with reference to FIGS. 1 through 9. In some examples, a UE may execute a set of instructions to control the functional elements of the UE to perform the described functions. Additionally, or alternatively, the UE may perform aspects of the described functions using special-purpose hardware.

At 1105, the method may include initiating successive cancellation list decoding for a set of multiple information bits according to a first list size, where the first list size is associated with a first number of decoding paths of a decoding tree for the set of multiple information bits, and where each decoding path of the first number of decoding paths is associated with a respective path metric of a set of path metrics. The operations of 1105 may be performed in accordance with examples as disclosed herein. In some examples, aspects of the operations of 1105 may be performed by an SCL decoding manager 825 as described with reference to FIG. 8.

At 1110, the method may include selecting a second list size based on a comparison between a first path metric and a product of a second path metric and a path metric threshold. The operations of 1110 may be performed in accordance with examples as disclosed herein. In some examples, aspects of the operations of 1110 may be performed by a path metric manager 840 as described with reference to FIG. 8.

At 1115, the method may include switching from the first list size to a second list size at a first node of the decoding tree, where the second list size is associated with a second number of decoding paths of the decoding tree for the set of multiple information bits, and where the first path metric and the second path metric have lower path metric values than a remainder of the set of path metrics. The operations of 1115 may be performed in accordance with examples as disclosed herein. In some examples, aspects of the operations of 1115 may be performed by a list size switching manager 830 as described with reference to FIG. 8.

At 1120, the method may include outputting the set of multiple information bits according to a result of the successive cancellation list decoding. The operations of 1120 may be performed in accordance with examples as disclosed herein. In some examples, aspects of the operations of 1120 may be performed by an information bit manager 835 as described with reference to FIG. 8.

Figure 12:
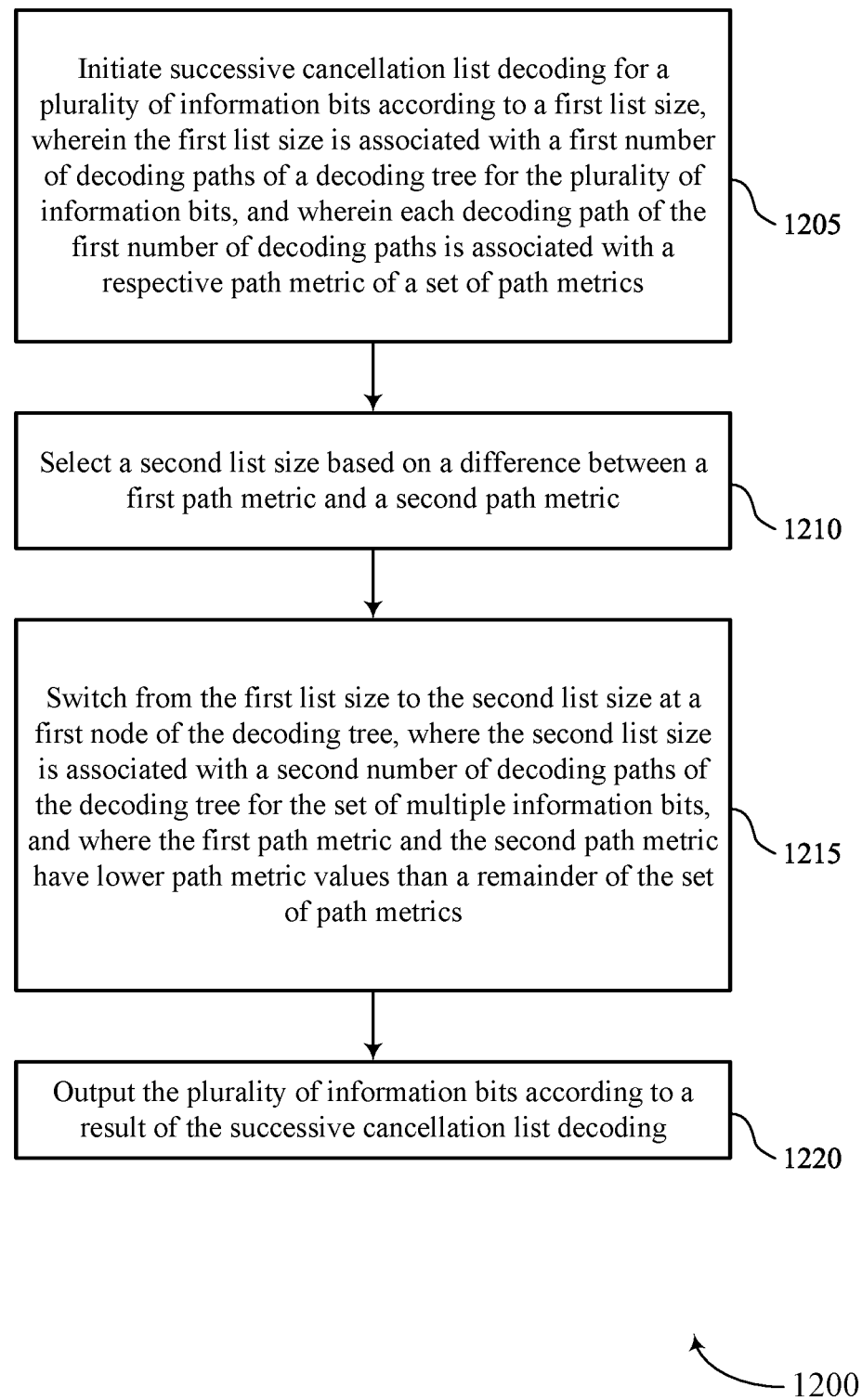

FIG. 12 shows a flowchart illustrating a method 1200 that supports list size reduction for polar decoding in accordance with one or more aspects of the present disclosure. The operations of the method 1200 may be implemented by a UE or its components as described herein. For example, the operations of the method 1200 may be performed by a UE 115 as described with reference to FIGS. 1 through 9. In some examples, a UE may execute a set of instructions to control the functional elements of the UE to perform the described functions. Additionally, or alternatively, the UE may perform aspects of the described functions using special-purpose hardware.

At 1205, the method may include initiating successive cancellation list decoding for a set of multiple information bits according to a first list size, where the first list size is associated with a first number of decoding paths of a decoding tree for the set of multiple information bits, and where each decoding path of the first number of decoding paths is associated with a respective path metric of a set of path metrics. The operations of 1205 may be performed in accordance with examples as disclosed herein. In some examples, aspects of the operations of 1205 may be performed by an SCL decoding manager 825 as described with reference to FIG. 8.

At 1210, the method may include selecting a second list size based on a difference between a first path metric and a second path metric. The operations of 1210 may be performed in accordance with examples as disclosed herein. In some examples, aspects of the operations of 1210 may be performed by a path metric manager 840 as described with reference to FIG. 8.

At 1215, the method may include switching from the first list size to the second list size at a first node of the decoding tree, where the second list size is associated with a second number of decoding paths of the decoding tree for the set of multiple information bits, and where the first path metric and the second path metric have lower path metric values than a remainder of the set of path metrics. The operations of 1215 may be performed in accordance with examples as disclosed herein. In some examples, aspects of the operations of 1215 may be performed by a list size switching manager 830 as described with reference to FIG. 8.

At 1220, the method may include outputting the set of multiple information bits according to a result of the successive cancellation list decoding. The operations of 1220 may be performed in accordance with examples as disclosed herein. In some examples, aspects of the operations of 1220 may be performed by an information bit manager 835 as described with reference to FIG. 8.

Figure 13:
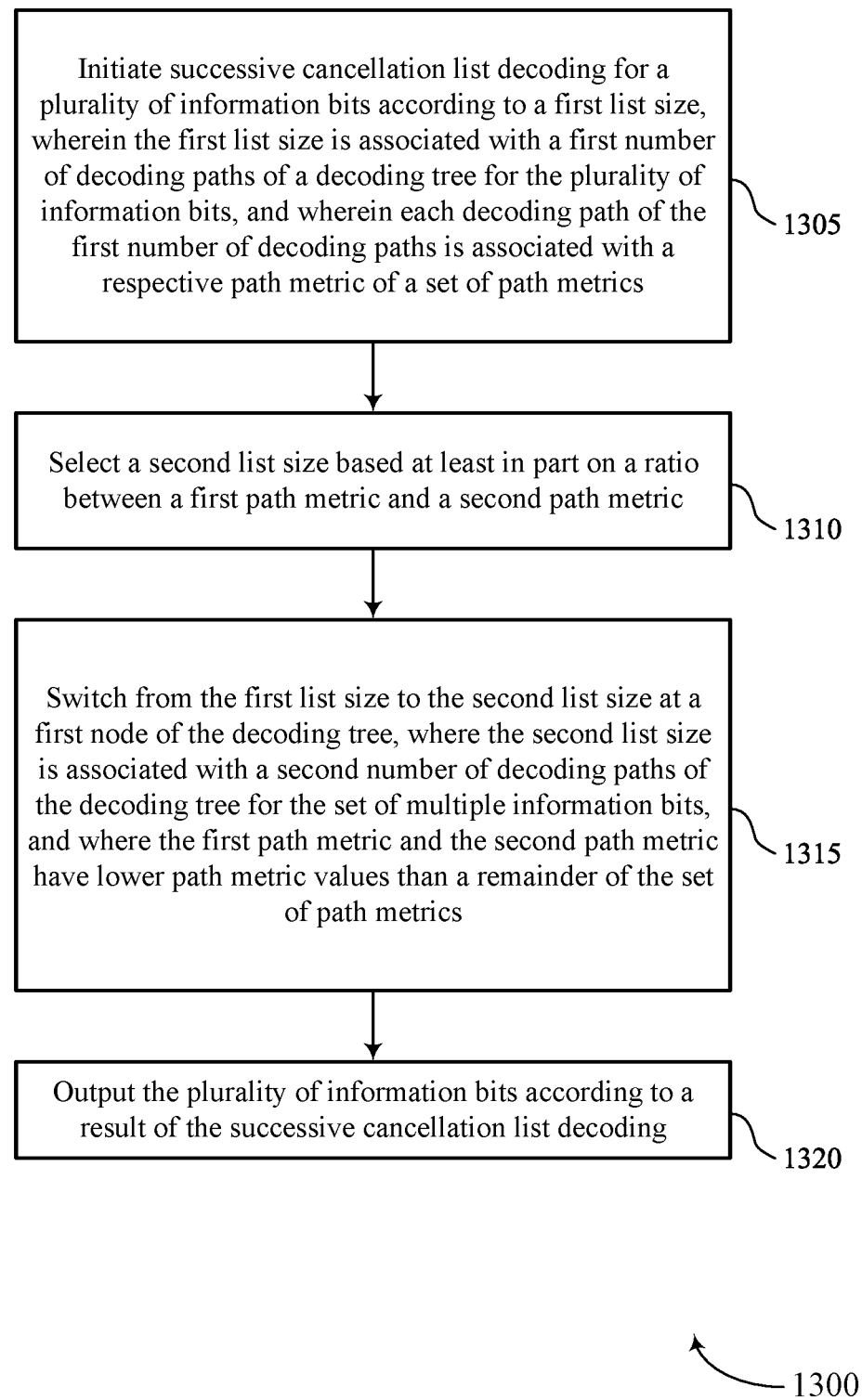

FIG. 13 shows a flowchart illustrating a method 1300 that supports list size reduction for polar decoding in accordance with one or more aspects of the present disclosure. The operations of the method 1300 may be implemented by a UE or its components as described herein. For example, the operations of the method 1300 may be performed by a UE 115 as described with reference to FIGS. 1 through 9. In some examples, a UE may execute a set of instructions to control the functional elements of the UE to perform the described functions. Additionally, or alternatively, the UE may perform aspects of the described functions using special-purpose hardware.

At 1305, the method may include initiating successive cancellation list decoding for a set of multiple information bits according to a first list size, where the first list size is associated with a first number of decoding paths of a decoding tree for the set of multiple information bits, and where each decoding path of the first number of decoding paths is associated with a respective path metric of a set of path metrics. The operations of 1305 may be performed in accordance with examples as disclosed herein. In some examples, aspects of the operations of 1305 may be performed by an SCL decoding manager 825 as described with reference to FIG. 8.

At 1310, the method may include selecting a second list size based at least in part on a ratio between a first path metric and a second path metric. The operations of 1310 may be performed in accordance with examples as disclosed herein. In some examples, aspects of the operations of 1310 may be performed by a path metric manager 840 as described with reference to FIG. 8.

At 1315, the method may include switching from the first list size to the second list size at a first node of the decoding tree, where the second list size is associated with a second number of decoding paths of the decoding tree for the set of multiple information bits, and where the first path metric and the second path metric have lower path metric values than a remainder of the set of path metrics. The operations of 1315 may be performed in accordance with examples as disclosed herein. In some examples, aspects of the operations of 1315 may be performed by a list size switching manager 830 as described with reference to FIG. 8.

At 1320, the method may include outputting the set of multiple information bits according to a result of the successive cancellation list decoding. The operations of 1320 may be performed in accordance with examples as disclosed herein. In some examples, aspects of the operations of 1320 may be performed by an information bit manager 835 as described with reference to FIG. 8.

The following provides an overview of aspects of the present disclosure:

Aspect 1: A method for wireless communications at a UE, comprising: initiating successive cancellation list decoding for a plurality of information bits according to a first list size, wherein the first list size is associated with a first number of decoding paths of a decoding tree for the plurality of information bits, and wherein each decoding path of the first number of decoding paths is associated with a respective path metric of a set of path metrics; switching from the first list size to a second list size at a first node of the decoding tree based at least in part on a first path metric and a second path metric of the set of path metrics, wherein the second list size is associated with a second number of decoding paths of the decoding tree for the plurality of information bits, and wherein the first path metric and the second path metric have lower path metric values than a remainder of the set of path metrics; and outputting the plurality of information bits according to a result of the successive cancellation list decoding.

Aspect 2: The method of aspect 1, wherein switching from the first list size to the second list size comprises: selecting the second list size based at least in part on a comparison between the first path metric and a product of the second path metric and a path metric threshold.

Aspect 3: The method of any of aspects 1 through 2, wherein switching from the first list size to the second list size comprises: selecting the second list size based at least in part on a difference between the first path metric and the second path metric.

Aspect 4: The method of any of aspects 1 through 3, wherein switching from the first list size to the second list size comprises: selecting the second list size based at least in part on a ratio between the first path metric and the second path metric.

Aspect 5: The method of any of aspects 1 through 4, further comprising: selecting the first path metric from the set of path metrics, wherein the first path metric has a lowest value of the set of path metrics and the second path metric has a value that is higher than the first path metric and lower than the remainder of the set of path metrics of the set of path metrics.

Aspect 6: The method of any of aspects 1 through 5, wherein switching from the first list size to the second list size comprises: selecting the second list size based at least in part on a number of information bits of the plurality of information bits previously processed during the successive cancellation list decoding satisfying a processing threshold.

Aspect 7: The method of any of aspects 1 through 6, wherein switching from the first list size to the second list size comprises: selecting the second list size based at least in part on a comparison between the first path metric and the second path metric satisfying a first path metric threshold and a second path metric threshold that is different from the first path metric threshold, the first path metric threshold corresponding to the second list size and the second path metric threshold corresponding to a third list size associated with a third number of decoding paths for the plurality of information bits.

Aspect 8: The method of any of aspects 1 through 7, further comprising: updating the first path metric, the second path metric, a number of information bits of the plurality of information bits previously processed during the successive cancellation list decoding, or any combination thereof; and performing the successive cancellation list decoding at a second node of the decoding tree based at least in part on the updated first path metric, the updated second path metric, the updated number of information bits previously processed during the successive cancellation list decoding, or any combination thereof, wherein outputting the plurality of information bits is based at least in part on performing the successive cancellation list decoding at a plurality of nodes of the decoding tree comprising at least the first node and the second node.

Aspect 9: The method of any of aspects 1 through 8, wherein the second list size is smaller than the first list size.

Aspect 10: An apparatus for wireless communications at a UE, comprising a processor; memory coupled with the processor; and instructions stored in the memory and executable by the processor to cause the apparatus to perform a method of any of aspects 1 through 9.

Aspect 11: An apparatus for wireless communications at a UE, comprising at least one means for performing a method of any of aspects 1 through 9.

Aspect 12: A non-transitory computer-readable medium storing code for wireless communications at a UE, the code comprising instructions executable by a processor to perform a method of any of aspects 1 through 9.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

The term "determine" or "determining" encompasses a variety of actions and, therefore, "determining" can include calculating, computing, processing, deriving, investigating, looking up (such as via looking up in a table, a database or another data structure), ascertaining and the like. Also, "determining" can include receiving (such as receiving information), accessing (such as accessing data in a memory) and the like. Also, "determining" can include resolving, obtaining, selecting, choosing, establishing and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus for wireless communications at a user equipment (UE), comprising:
a processor;
memory coupled with the processor; and
instructions stored in the memory and executable by the processor to cause the apparatus to:
initiate successive cancellation list decoding for a plurality of information bits according to a first list size, wherein the first list size is associated with a first number of decoding paths of a decoding tree for the plurality of information bits, and wherein each decoding path of the first number of decoding paths is associated with a respective path metric of a set of path metrics;
switch from the first list size to a second list size at a first node of the decoding tree based at least in part on a first path metric and a second path metric of the set of path metrics, wherein the second list size is associated with a second number of decoding paths of the decoding tree for the plurality of information bits, and wherein the first path metric and the second path metric have lower path metric values than a remainder of the set of path metrics; and
output the plurality of information bits according to a result of the successive cancellation list decoding.

2. The apparatus of claim 1, wherein the instructions to switch from the first list size to the second list size are executable by the processor to cause the apparatus to:
select the second list size based at least in part on a comparison between the first path metric and a product of the second path metric and a path metric threshold.

3. The apparatus of claim 1, wherein the instructions to switch from the first list size to the second list size are executable by the processor to cause the apparatus to:
  select the second list size based at least in part on a difference between the first path metric and the second path metric.

4. The apparatus of claim 1, wherein the instructions to switch from the first list size to the second list size are executable by the processor to cause the apparatus to:
  select the second list size based at least in part on a ratio between the first path metric and the second path metric.

5. The apparatus of claim 1, wherein the instructions are further executable by the processor to cause the apparatus to:
  select the first path metric from the set of path metrics, wherein the first path metric has a lowest value of the set of path metrics and the second path metric has a value that is higher than the first path metric and lower than the remainder of the set of path metrics of the set of path metrics.

6. The apparatus of claim 1, wherein the instructions to switch from the first list size to the second list size are executable by the processor to cause the apparatus to:
  select the second list size based at least in part on a number of information bits of the plurality of information bits previously processed during the successive cancellation list decoding satisfying a processing threshold.

7. The apparatus of claim 1, wherein the instructions to switch from the first list size to the second list size are executable by the processor to cause the apparatus to:
  select the second list size based at least in part on a comparison between the first path metric and the second path metric satisfying a first path metric threshold and a second path metric threshold that is different from the first path metric threshold, the first path metric threshold corresponding to the second list size and the second path metric threshold corresponding to a third list size associated with a third number of decoding paths for the plurality of information bits.

8. The apparatus of claim 1, wherein the instructions are further executable by the processor to cause the apparatus to:
  update the first path metric, the second path metric, a number of information bits of the plurality of information bits previously processed during the successive cancellation list decoding, or any combination thereof; and
  perform the successive cancellation list decoding at a second node of the decoding tree based at least in part on the updated first path metric, the updated second path metric, the updated number of information bits previously processed during the successive cancellation list decoding, or any combination thereof, wherein outputting the plurality of information bits is based at least in part on performing the successive cancellation list decoding at a plurality of nodes of the decoding tree comprising at least the first node and the second node.

9. The apparatus of claim 1, wherein the second list size is smaller than the first list size.

10. A method for wireless communications at a user equipment (UE), comprising:
  initiating successive cancellation list decoding for a plurality of information bits according to a first list size, wherein the first list size is associated with a first number of decoding paths of a decoding tree for the plurality of information bits, and wherein each decoding path of the first number of decoding paths is associated with a respective path metric of a set of path metrics;
  switching from the first list size to a second list size at a first node of the decoding tree based at least in part on a first path metric and a second path metric of the set of path metrics, wherein the second list size is associated with a second number of decoding paths of the decoding tree for the plurality of information bits, and wherein the first path metric and the second path metric have lower path metric values than a remainder of the set of path metrics; and
  outputting the plurality of information bits according to a result of the successive cancellation list decoding.

11. The method of claim 10, wherein switching from the first list size to the second list size comprises:
  selecting the second list size based at least in part on a comparison between the first path metric and a product of the second path metric and a path metric threshold.

12. The method of claim 10, wherein switching from the first list size to the second list size comprises:
  selecting the second list size based at least in part on a difference between the first path metric and the second path metric.

13. The method of claim 10, wherein switching from the first list size to the second list size comprises:
  selecting the second list size based at least in part on a ratio between the first path metric and the second path metric.

14. The method of claim 10, further comprising:
  selecting the first path metric from the set of path metrics, wherein the first path metric has a lowest value of the set of path metrics and the second path metric has a value that is higher than the first path metric and lower than the remainder of the set of path metrics of the set of path metrics.

15. The method of claim 10, wherein switching from the first list size to the second list size comprises:
  selecting the second list size based at least in part on a number of information bits of the plurality of information bits previously processed during the successive cancellation list decoding satisfying a processing threshold.

16. The method of claim 10, wherein switching from the first list size to the second list size comprises:
  selecting the second list size based at least in part on a comparison between the first path metric and the second path metric satisfying a first path metric threshold and a second path metric threshold that is different from the first path metric threshold, the first path metric threshold corresponding to the second list size and the second path metric threshold corresponding to a third list size associated with a third number of decoding paths for the plurality of information bits.

17. The method of claim 10, further comprising:
  updating the first path metric, the second path metric, a number of information bits of the plurality of information bits previously processed during the successive cancellation list decoding, or any combination thereof; and
  performing the successive cancellation list decoding at a second node of the decoding tree based at least in part on the updated first path metric, the updated second path metric, the updated number of information bits previously processed during the successive cancellation list decoding, or any combination thereof, wherein outputting the plurality of information bits is based at least in part on performing the successive cancellation list decoding at a plurality of nodes of the decoding tree comprising at least the first node and the second node.

18. The method of claim 10, wherein the second list size is smaller than the first list size.

19. A non-transitory computer-readable medium storing code for wireless communications at a user equipment (UE), the code comprising instructions executable by a processor to:
  initiate successive cancellation list decoding for a plurality of information bits according to a first list size, wherein the first list size is associated with a first number of decoding paths of a decoding tree for the plurality of information bits, and wherein each decoding path of the first number of decoding paths is associated with a respective path metric of a set of path metrics;
  switch from the first list size to a second list size at a first node of the decoding tree based at least in part on a first path metric and a second path metric of the set of path metrics, wherein the second list size is associated with a second number of decoding paths of the decoding tree for the plurality of information bits, and wherein the first path metric and the second path metric have lower path metric values than a remainder of the set of path metrics; and
  output the plurality of information bits according to a result of the successive cancellation list decoding.

20. The non-transitory computer-readable medium of claim 19, wherein the instructions to switch from the first list size to the second list size are executable by the processor to:
  select the second list size based at least in part on a comparison between the first path metric and a product of the second path metric and a path metric threshold.

21. The non-transitory computer-readable medium of claim 19, wherein the instructions to switch from the first list size to the second list size are executable by the processor to:
  select the second list size based at least in part on a difference between the first path metric and the second path metric.

22. The non-transitory computer-readable medium of claim 19, wherein the instructions to switch from the first list size to the second list size are executable by the processor to:
  select the second list size based at least in part on a ratio between the first path metric and the second path metric.

23. The non-transitory computer-readable medium of claim 19, wherein the instructions are further executable by the processor to:
  select the first path metric from the set of path metrics, wherein the first path metric has a lowest value of the set of path metrics and the second path metric has a value that is higher than the first path metric and lower than the remainder of the set of path metrics of the set of path metrics.

24. The non-transitory computer-readable medium of claim 19, wherein the instructions to switch from the first list size to the second list size are executable by the processor to:
  select the second list size based at least in part on a number of information bits of the plurality of information bits previously processed during the successive cancellation list decoding satisfying a processing threshold.

25. The non-transitory computer-readable medium of claim 19, wherein the instructions to switch from the first list size to the second list size are executable by the processor to:
  select the second list size based at least in part on a comparison between the first path metric and the second path metric satisfying a first path metric threshold and a second path metric threshold that is different from the first path metric threshold, the first path metric threshold corresponding to the second list size and the second path metric threshold corresponding to a third list size associated with a third number of decoding paths for the plurality of information bits.

26. The non-transitory computer-readable medium of claim 19, wherein the instructions are further executable by the processor to:
  update the first path metric, the second path metric, a number of information bits of the plurality of information bits previously processed during the successive cancellation list decoding, or any combination thereof; and
  perform the successive cancellation list decoding at a second node of the decoding tree based at least in part on the updated first path metric, the updated second path metric, the updated number of information bits previously processed during the successive cancellation list decoding, or any combination thereof, wherein outputting the plurality of information bits is based at least in part on performing the successive cancellation list decoding at a plurality of nodes of the decoding tree comprising at least the first node and the second node.

27. The non-transitory computer-readable medium of claim 19, wherein the second list size is smaller than the first list size.

28. An apparatus for wireless communications at a user equipment (UE), comprising:
  means for initiating successive cancellation list decoding for a plurality of information bits according to a first list size, wherein the first list size is associated with a first number of decoding paths of a decoding tree for the plurality of information bits, and wherein each decoding path of the first number of decoding paths is associated with a respective path metric of a set of path metrics;
  means for switching from the first list size to a second list size at a first node of the decoding tree based at least in part on a first path metric and a second path metric of the set of path metrics, wherein the second list size is associated with a second number of decoding paths of the decoding tree for the plurality of information bits, and wherein the first path metric and the second path metric have lower path metric values than a remainder of the set of path metrics; and
  means for outputting the plurality of information bits according to a result of the successive cancellation list decoding.

29. The apparatus of claim 28, wherein the means for switching from the first list size to the second list size comprise:
  means for selecting the second list size based at least in part on a comparison between the first path metric and a product of the second path metric and a path metric threshold.

30. The apparatus of claim 28, wherein the means for switching from the first list size to the second list size comprise:
  means for selecting the second list size based at least in part on a difference between the first path metric and the second path metric.

* * * * *